United States Patent [19]
Atkinson

[11] Patent Number: 6,134,167
[45] Date of Patent: Oct. 17, 2000

[54] REDUCING POWER CONSUMPTION IN COMPUTER MEMORY

[75] Inventor: Lee W. Atkinson, Houston, Tex.

[73] Assignee: Compaq Computer Corporation, Houston, Tex.

[21] Appl. No.: 09/090,426

[22] Filed: Jun. 4, 1998

[51] Int. Cl.[7] .................................................... G11C 7/00
[52] U.S. Cl. ........................................... 365/222; 365/229
[58] Field of Search .................................. 365/222, 228, 365/229; 711/106

[56] References Cited

U.S. PATENT DOCUMENTS

| | | | |
|---|---|---|---|
| 4,393,477 | 7/1983 | Murstani | 365/222 |
| 4,616,346 | 10/1986 | Nakaizumi et al. | 365/222 |
| 4,716,551 | 12/1987 | Inagaki | 365/222 |
| 4,901,283 | 2/1990 | Hanbury et al. | 365/222 |
| 5,262,998 | 11/1993 | Mnich et al. | 365/222 |
| 5,278,796 | 1/1994 | Tillinghast et al. | 365/222 |
| 5,313,428 | 5/1994 | Inoue | 365/222 |
| 5,321,662 | 6/1994 | Ogawa | 365/222 |
| 5,379,400 | 1/1995 | Barakat et al. | 365/222 |
| 5,465,367 | 11/1995 | Reddy et al. | 365/222 |
| 5,495,452 | 2/1996 | Cha | 365/222 |
| 5,680,359 | 10/1997 | Jeong | 365/222 |
| 5,784,328 | 7/1998 | Irrinki et al. | 365/222 |
| 5,801,982 | 9/1998 | Blodgett | 365/222 |
| 5,808,952 | 9/1998 | Fung et al. | 365/222 |
| 5,828,619 | 10/1998 | Hirano et al. | 365/222 |

OTHER PUBLICATIONS

*Computer Organization and Design* by John L. Hennessy and David A. Patterson; Morgan Kaufmann Publishers, Inc., San Francisco, California.

LM75, *Digital Temperature Sensor and Thermal Watchdog with Two–Wire Interface*, National Semiconductor, Oct. 1997.

*Primary Examiner*—Tan T. Nguyen
*Attorney, Agent, or Firm*—Conley, Rose & Tayon, P.C.; Michael F. Heim; Jonathan M. Harris

[57] ABSTRACT

A computer system comprising an input/output device, a processor, a memory device, and a bridge logic device for interfacing the memory device to the processor and input/output device incorporates a refresh logic device for generating a memory refresh signal during suspend mode. Because the rate at which memory must be refreshed generally depends on the temperature of the memory device, the refresh logic varies the frequency of the refresh signal according to the temperature of the memory device, resulting in substantial power savings. In a preferred embodiment, the refresh logic uses a normal-rate refresh signal at the beginning of suspend mode and incrementally steps down the refresh rate as the memory temperature decreases. In other embodiments, the refresh logic incorporates a signal generator which produces a refresh signal at a frequency that varies according to the output voltage from a temperature sensor or the temperature-sensitive resistance of a thermistor. In yet another embodiment, a variable-rate refresh logic is incorporated into the memory device, resulting in a self-refreshing memory module.

24 Claims, 10 Drawing Sheets

REDUCING POWER CONSUMPTION IN COMPUTER MEMORY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

Field of the Invention

The present invention relates generally to memory operation within computer systems and particularly to power management in computer memory. More particularly, the invention relates to an improved technique for reducing electric power consumption by computer memory.

BACKGROUND OF THE INVENTION

Computer systems, generally are microprocessor-based, programmable electronic devices which retrieve, store, and process data. Consequently, computer systems require electric energy to operate. A computer typically receives electric energy from one or more of a variety of sources, including alternating current (AC) provided by a wall socket, direct current (DC) provided by a battery, or even "solar" power provided by photovoltaic cells. Because computers typically require a DC energy source, a computer receiving energy from an AC energy source will generally convert the alternating current to direct current via special power supply circuitry.

Each component inside a computer requires a minimum level of electric power, defined as the rate at which electric energy is delivered from an energy source, to operate. A computer with more components generally consumes (or "draws") more power than a computer with fewer components. Increasing the number of components in the computer system, however, generally results in greater computing capabilities. Accordingly, computer systems with more components, or greater "complexity," typically draw more power than do computer systems with lower complexity. Because laptops and handheld computers may draw power from battery that has a finite amount of energy, the amount of power available in the battery is especially important for these devices. In particular, transistors comprise a major portion of the components (including "computer chips") in modem computers and thus largely affect computer power requirements. A typical personal computer with 16 megabytes (MB) of dynamic random access memory (DRAM), or approximately 16 million memory storage locations, may have about 150 million transistors, including the transistors used for the DRAM. In fact, as many as 140 million of the 150 million transistors may be used for the DRAM. A personal computer with 64 MB of DRAM will typically require over 520 million transistors for DRAM alone. The transistors generally are microscopically small and are fabricated from a semiconductor substrate such as silicon or gallium arsenide. Other computer components require significant amounts of power, as well, including the computer monitor and components with moving parts such as hard disk drives, floppy disk drives, tape drives, and compact disc drives. Ultimately, virtually every electrical or moving component draws electric power and contributes to the total energy consumption of the computer system.

While it is generally possible to construct a power supply capable of meeting the power demands of most computer systems, delivering excessive levels of power creates a number of detrimental side effects. For one, most electrical components dissipate spent electrical energy as heat. Since electric power represents the rate of energy consumption, devices which draw more power use more energy in a given time period, dissipating heat at a faster rate. To avoid overheating from power dissipation, many computer components are constructed with or attached to heat sinks to channel the heat away from the device. Most larger computer systems, such as desktop and portable laptop computers, additionally utilize fans to direct air currents over the components and heat sinks, channeling the heat into the air outside the computer enclosure. However, as computer system complexity continues to rise, it becomes harder to remove the heat generated by the increasing number of electrical components.

Another important consequence of excessive power consumption is that higher power levels, by definition, indicate that electric energy is being consumed at a faster rate. Hence, computer systems, which may range from handheld calculators and electronic games to personal computers and even massive computing systems, require a greater total energy reserve to produce the increased level of power required to fuel the more and more complex computer designs needed to meet increasing demands on computer functionality. For computer systems which operating from AC current provided by an electric utility company, increased power elevates the total amount of energy consumed and, thus, the electric bill. Battery-powered devices, however, such as portable computers and cellular telephones, are inherently limited to using that energy which can be contained in the battery. Because the energy capacity of a battery directly determines the duration over which such a device can operate, it is necessary to increase battery capacity and/or reduce consumed power (or "battery drain") to allow such devices to operate for an adequate length of time.

In general, increasing the energy storage capacity of a battery increases the size and/or density of the battery material. Because portable devices such as laptop computers, handheld computers, and calculators are designed to be small and lightweight, it usually is not desirable to use larger batteries to increase the operational life of the portable device. In fact, although advances in battery technology continue to improve the capacity and efficiency of portable batteries, it is always desirable for portable computer systems to be able to operate for longer periods of time. While some laptop personal computers may accommodate batteries which operate for significant lengths of time without recharging, such batteries often make the computer too uncomfortably heavy. Other laptop computers, on the other hand, contain lighter, but less powerful batteries, which power for the computer for relatively little time. Smaller devices like palmtop (i.e., handheld) computers, portable laser scanners, and cellular phones typically have even smaller size requirements than do laptop computers and therefore must accommodate even smaller, lower-capacity batteries. Consequently, such devices may operate for relatively short lengths of time, often only a few hours of talk time for typical portable cellular handsets.

Although battery manufacturers continuously strive to develop smaller, more powerful batteries, manufacturers of equipment that uses batteries have proposed various methods to reduce the power consumed by the equipment. For example, integrated circuits made from semiconductor materials have been developed that use a reduced-voltage power supply to decrease battery drain. The continuing rise in computer system speed tends to offset the power saved by using reduced-voltage transistors, however, due to the fact that all transistors tend to draw more power at high speeds.

In the last few years, numerous computer operating protocols have been developed that enable personal computer systems to shut off or reduce power during periods of inactivity. Some computers, such as laptop or portable computers, can detect a periods of inactivity by the user and place the computer in a low-power "sleep" mode. During sleep mode, the computer may cause the hard drive to "spin down," stopping the magnetic disks of the hard drive from rotating to reduce power. Similarly, the computer may place the monitor into a special, low-power standby mode or even switch the monitor completely off. During these types of low-power modes, the computer generally requires power (battery power for a portable computer) to maintain the contents of dynamic random access memory (DRAM). Until the user "wakes" the computer by pressing a key on the keyboard or clicking the mouse, the computer operates at a reduced power level. Many cellular and cordless phone handsets switch into a similar type of battery-saving sleep mode upon termination of each phone call. Until subsequent activation by the user, many of these mobile handsets operate with minimum functionality between calls, awakening periodically to monitor a communications channel for incoming calls.

Although power drain on the battery is reduced during sleep mode, a computer still uses a finite amount of battery power to maintain memory and other minimum functions. Hence, the device may operate only until the available battery power is drained. While a mobile phone may sustain power for a matter of days under sleep mode, a typical laptop can run for only a matter of hours in sleep mode. The reason for this limitation is that computer memory typically requires a finite amount of power to maintain the memory contents during sleep mode. Most personal computers as well as other computer systems include some type of dynamic random access memory (DRAM) as the main computer memory. In addition to conventional DRAM, other such types of DRAM commonly used are synchronous DRAM (SDRAM), extended data output DRAM (EDO DRAM), and Rambus™ DRAM (RDRAM). All of these types of DRAM must receive a periodic voltage pulse, called a refresh signal, to recharge, or "refresh" the memory storage elements on a regular basis. Because a finite amount of power is required to generate the refresh signal, the computer experiences a gradual battery drain during sleep mode. If power is turned off to the computer, the refresh signal cannot be generated. Without the memory refresh signal, however, the contents of memory will be lost.

Refreshing a DRAM module involves applying the memory refresh signal to each storage element within that DRAM module. A DRAM storage element uses a capacitor to store one bit of data. If the capacitor is electrically charged, then that bit generally represents a logic "1." If the capacitor is not charged, then that bit generally represents a logic "0." The reason for refreshing the memory storage elements periodically is that electric charge slowly drains from the charged capacitors over time. If an uncharged capacitor (representing a logic "0") receives the refresh signal, then that capacitor stays uncharged. If a charged capacitor (representing a logic "1") receives the refresh signal before it completely discharges, however, that charged capacitor recharges to full capacity. Thus, the memory contents are maintained by refreshing each memory storage location often enough to ensure that the charged capacitors do not completely discharge. Currently, a DRAM capacitor representing one storage element requires charging at a rate of approximately 64 kilohertz (kHz), which represents charging that storage element 64,000 times per second.

In general, DRAM modules currently may contain millions of storage elements (or "bits") which are arranged as an array of rows and columns. The bits along each row are connected to a common signal line called the Row Address Strobe (RAS), and the bits along a given column are connected to a common signal line called the Column Address Strobe (CAS). The RAS and CAS lines are also sometimes referred to as the also referred to as the Row Access Strobe and Column Access Strobe, respectively. The RAS/CAS configuration allows all bits of a given row to be refreshed simultaneously by asserting the RAS line of that row. Although the refresh pulse is typically generated by a source external to the DRAM module, some DRAM modules incorporate on-chip refreshing. To allow each row to be refreshed from a refresh pulse, a DRAM chip typically incorporates a counter that tracks which row was most recently refreshed. After each refresh pulse, the counter is incremented to the next row of the memory array. After the final row of the memory array is refreshed, the counter resets to the beginning of the memory array. Hence, each RAS signal becomes asserted in turn during a sequence of repeated refresh cycles, assuring that all memory storage elements are recharged. It follows that the frequency of the refresh pulse is calculated as the number of rows in the DRAM module multiplied by the required refresh rate of a given bit. For a more detailed explanation of DRAM and refreshing techniques, refer to *Computer Organization and Design* by Patterson and Hennessy (Morgan Kaufmann Publishers, Inc., 1994).

In memory modules that include on-chip refreshing, the refresh circuitry generally comprises a resistive/capacitive (RC) oscillator. Because of the difficulty of integrating accurate RC oscillators in semiconductor memory devices, however, many of these oscillators are "over-designed" to operate at well above the frequency needed to refresh memory. Thus, if the device oscillates more slowly than intended, the memory contents are not jeopardized. These internal RC oscillators tend to consume more power than off-chip refreshing circuitry, however, since the off-chip circuits typically generate more accurate refresh frequencies and are therefore designed to operate closer to the proper refresh frequency.

To invoke another type of low-power mode, some computers have a special "suspend" button or a "suspend" menu item (e.g., Windows 95) that suspends all computer operation except for the main memory and an input/output interface (which includes the suspend button). Some computers also initiate this "suspend mode" automatically after a period of user inactivity. During suspend mode, the CPU, monitor, hard disk, floppy disk, CD ROM drive, all other peripheral devices and input ports, and all computer clocks and other timing devices are deactivated, and computer activity ceases. In some computer systems, the power supply additionally is removed from these deactivated devices. The input/output interface further provides a refresh signal to memory so that the memory data remains intact throughout the suspend mode. Refreshing the memory during suspend mode still requires significant battery power, however, in part because memory chips comprise such a large proportion of the transistors in a computer system. The input/output device also restores the computer to normal operating mode if the suspend switch is pressed again.

In order to further reduce power consumption during suspend mode, the memory contents in some computers are compressed using known, complex mathematical algorithms just prior to entering suspend mode. When compressed, the memory contents may fit into a smaller portion of memory. During suspend mode, only the portion of memory containing the compressed data is refreshed, and the remaining memory is powered down along with the rest of the computer. When the computer awakes from suspend mode, the compressed memory contents are decompressed, and the original memory contents are restored. Because the computer provides power during suspend mode to only the few memory chips which hold the compressed data, the battery drain during suspend mode is reduced.

Compressing and decompressing the memory contents before and after suspend mode, however, often requires a significant delay before the computer powers down. Because suspend mode normally allows the user to effectively shut down and then restart the computer without having to endure a lengthy restart or boot sequence, the time required for compressing the memory prior to suspend mode can be a significant drawback. Also, the level of memory reduction that compression provides may not always be significant. For instance, computers running memory management software to compress the main memory during normal operation or computers handling compressed data such as image files may not benefit from additional memory compression during suspend mode. Thus, despite the benefits of such a technique, suspend mode compression can be slow and susceptible to performance inconsistencies.

Another technique to reduce battery drain during suspend mode is to store the memory contents into a special backup file on a magnetic disk such as a hard disk or floppy disk. The computer then completely shuts down memory during suspend mode, so that the memory requires no battery power. When the computer wakes from suspend mode, the memory contents are restored from the disk. In this method, however, the system must wait first for the computer to back up the memory before suspension and also must wait for the computer to restore the memory contents after suspension. Also, this method may require a significant amount of disk space which may or may not be available, depending on the size of the disk. Accordingly, computers without sufficient resources to create a backup file may be unable to implement this method.

For the foregoing reasons, an effective and reliable method to reduce battery drain without incurring a substantial penalty in user time or computer resources would greatly improve the usefulness of portable computing devices. Such an apparatus, if devised, could significantly improve the duration of portable battery life without the drawbacks of current power management methods. Unfortunately, to date, no device is available that provides these features.

SUMMARY OF THE INVENTION

Accordingly, there is provided herein a computer system comprising an input/output device, a processor, a memory device, a bridge logic device for interfacing the memory device to the processor and input/output device, and a refresh logic coupled to the bridge logic device for generating the refresh signal. Because the rate at which memory must be refreshed generally depends on the temperature of the memory device, the refresh logic provides a periodic refresh signal having a frequency that may be varied according to the temperature of the memory device. In general, the refresh rate of a memory device may be decreased as the temperature of the memory device decreases. Because the power consumed by main memory is approximately proportional to the refresh rate, decreasing the rate (or "frequency") of the refresh signal may result in substantial energy savings.

While the refresh rate may be varied according to temperature during normal computer operation, the present invention is directed to memory operation during suspend mode. Because most of the computer system is inactive during suspend mode, the computer components generate little or no heat. Accordingly, the computer tends to decrease in temperature, often to nearly room temperature. When the computer cools sufficiently, the refresh rate is decreased, resulting in lower power consumption.

In a preferred embodiment, the refresh logic generates two different periodic signals, using a reference timing signal to generate the first periodic signal and a frequency divider to produce a second periodic signal based on the reference timing signal. Accordingly, the second periodic signal has a lower rate than does the first periodic signal. The refresh logic uses either the reference timing signal or the second, slower periodic signal to refresh memory, depending on the temperature of the memory device. If the memory temperature is relatively high, then the faster, reference timing signal is used to refresh memory. If the memory temperature is relatively low, then the slower periodic signal is used for refreshing memory. Both periodic signals are received by a switch in the refresh logic that selects the refresh signal according to the memory temperature.

The memory temperature preferably is estimated using a counter, included in the refresh logic, that is programmed to begin counting when suspend mode begins. Accordingly, the counter asserts a select signal at a predetermined time, corresponding to the time when the memory temperature is expected to surpass a predetermined temperature threshold. Before the select signal is asserted, the refresh logic asserts the reference timing signal to refresh the memory device, since the memory temperature is expected to be relatively high. When the counter asserts the select signal, indicating that the memory temperature has decreased below the predetermined threshold, the refresh logic asserts the lower-frequency periodic signal to refresh the memory device. Because the temperature has decreased by the time the select signal is asserted, the memory device is able to retain its memory data while saving battery energy with the slower refresh signal.

In one alternative embodiment, the refresh logic uses a temperature sensor to assert the select signal when the memory temperature surpasses a predetermined temperature threshold. When the select signal is asserted, the refresh logic uses the lower-frequency signal to refresh memory. The temperature sensor preferably is constructed using a thermistor, which behaves as a temperature-dependent resistor and provides a temperature-varying voltage to a comparator. The comparator compares the temperature-varying voltage to a reference voltage which corresponds to the voltage produced by the thermistor at the predetermined temperature threshold. If the temperature-varying voltage is greater than or equal to the reference voltage, indicating that the thermistor temperature is less than or equal to the predetermined temperature, then the comparator asserts the select signal, and the refresh logic lowers the refresh rate.

In other alternative embodiments, the refresh logic generates a plurality of periodic signals, each having different rates. The reference timing signal produces the fastest-rate periodic signal, and a plurality of frequency-dividers transform the reference timing signal into other, slower-rate periodic signals. During suspend mode, the refresh logic selects the lowest-frequency signal that is suitable for refreshing memory without incurring data loss. The refresh logic receives the periodic signals through a multiplexer, which selects one of the periodic signals as the refresh signal. When suspend mode is initiated in one embodiment, a counter begins counting to identify the predetermined times at which the refresh rate may be lowered. Accordingly, each predetermined time represents the time at which the computer is expected to cool to a corresponding predetermined temperature. When the counter reaches one of the predetermined times, the counter generates the select signal to choose the refresh rate that is most appropriate for the expected memory temperature at that predetermined time. At the beginning of suspend mode, the reference timing signal supplies the refresh signal. As the computer cools, the counter selects a lower refresh rate whenever the counter value reaches the next predetermined time. In this manner, the refresh rate is gradually decreased to a very low rate, resulting in a substantial power reduction.

In a similar embodiment, a temperature sensor with a plurality of comparators compares the memory temperature to a set of predetermined reference temperatures. The predetermined reference temperatures correspond to the temperatures below which the plurality of periodic signals may be used to refresh memory. When the computer first enters suspend mode, the refresh logic uses the reference timing signal to refresh memory. When the temperature sensor detects a decrease in the memory temperature below a predetermined temperature threshold, the refresh logic lowers the refresh rate by selecting the periodic signal appropriate to that temperature threshold.

In yet another embodiment, the refresh rate is generated by incorporating a temperature sensor into a frequency generator, resulting in a continuously-varying refresh frequency. One temperature sensor comprises a thermistor coupled to a capacitor and an inverter. Since the output frequency of the inverter depends on the resistance and capacitance provided by the thermistor and capacitor, respectively, changes in temperature that affect the resistance of the thermistor also affect the output frequency of the inverter. Accordingly, the inverter provides a refresh signal that continuously decreases as the memory temperature decreases and continuously increases as the memory temperature increases. The resulting refresh signal is immediately responsive to changes in memory temperature.

In one embodiment, the temperature-sensitive frequency generator is incorporated into main memory, resulting in a self-refreshing memory device. The self-refreshing memory device receives the suspend signal indicating suspend mode. Accordingly, the memory device uses the temperature-sensitive frequency generator to refresh memory during suspend mode without the need for external refreshing circuitry.

Thus, the present invention comprises a combination of features and advantages that enable it to save substantial amounts of power in a computer system by providing a device and method for varying the memory refresh rate according to memory temperature. These and various other characteristics and advantages of the present invention will be readily apparent to those skilled in the art upon reading the following detailed description of the preferred embodiments of the invention and by referring to the accompanying drawings.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF PREFERRED EMBODIMENTS

Figure 1:
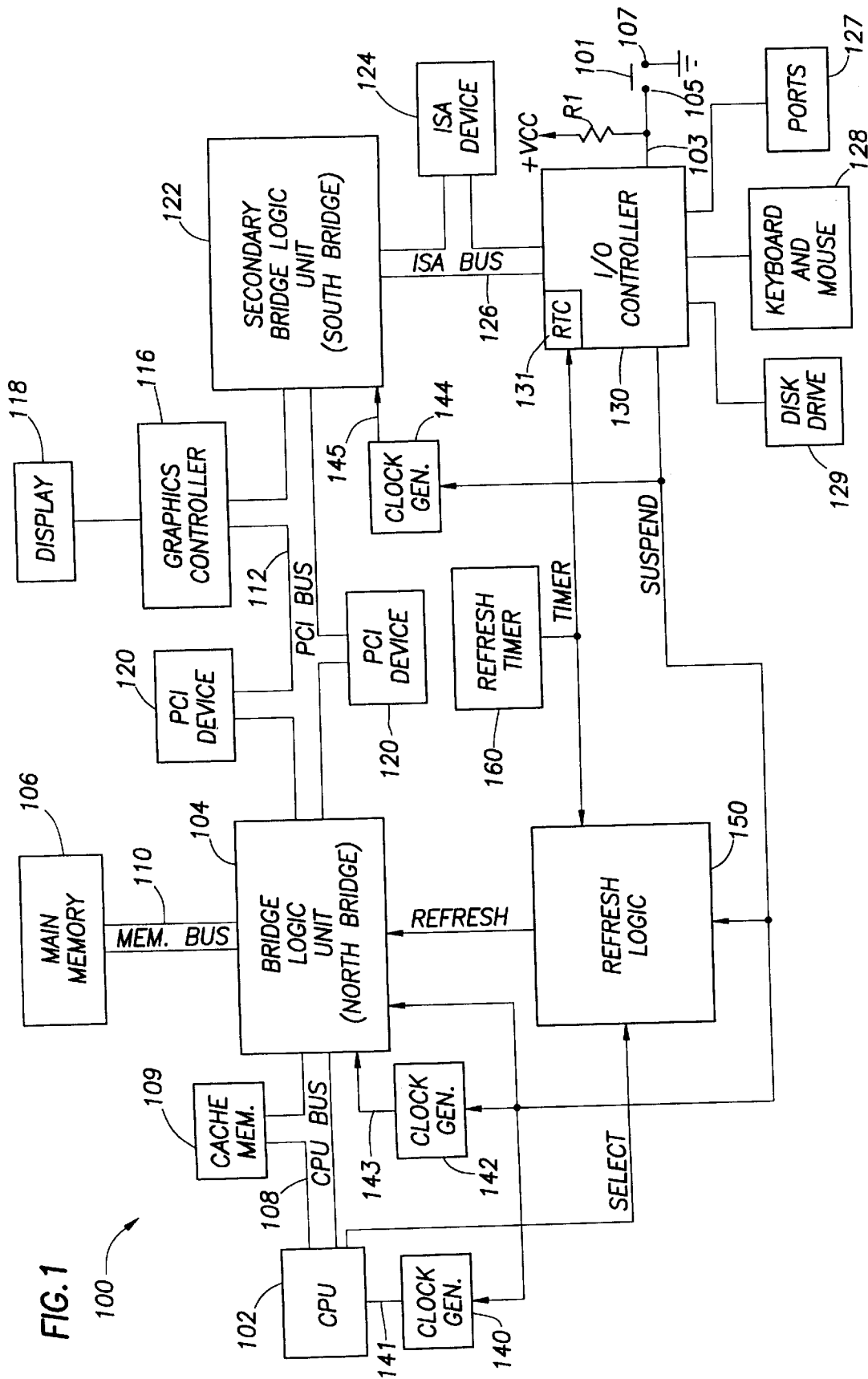
FIG. 1 illustrates an exemplary block diagram of a computer system constructed in accordance with the preferred embodiment.

Referring now to FIG. 1, a computer system 100 constructed in accordance with the preferred embodiment generally includes a central processing unit (CPU) 102 coupled to a variety of system components through an integrated bridge logic (or "North bridge") unit 104. The CPU 102 preferably couples to the North bridge 104 via a CPU bus 108. An external cache memory unit 109 may further couple to the CPU bus 108, if desired. As shown, a main memory 106 couples to the North bridge 104 through a memory bus 110. Additionally, a plurality of Peripheral Component Interconnect (PCI) devices 120 couple to the North bridge 104 through a PCI bus 112 in the preferred embodiment. A graphics controller 116 preferably couples to the North bridge 104 through the PCI bus 112 as well, although the graphics controller 116 may couple to any suitable graphics bus, such as an Advanced Graphics Port (AGP) bus. North bridge unit 104 generally coordinates the transfer of data and software between buses 108, 110, and 112. A display device 118 couples to the graphics controller 116.

The CPU 102 is illustrative of, for example, a Pentium®, Pentium® Pro, or Pentium® II Microprocessor. It should be understood, however, that other alternative types of microprocessors could be employed. Further, an embodiment of computer system 100 may include a multiple-CPU architecture, with a plurality of processors coupled through the CPU bus 108 to the North bridge 104.

The main memory 106 generally includes a conventional memory device or array of memory devices which store application programs and data. Main memory 106 is thus the main working memory for computer system 100 and preferably includes any suitable type of memory such as dynamic random access memory (DRAM) or any of the special types of DRAM devices such as synchronous dynamic random access memory (SDRAM), extended data output DRAM (EDO DRAM), or Rambus™ DRAM (DRAM). Main memory 106 preferably is adapted to receive refresh signals via Row Address Strobe (RAS) and Column Address Strobe (CAS) signals. Although not illustrated specifically in FIG. 1, the use of RAS and CAS signals to refresh main memory 106 will be described in more detail with respect to FIGS. 2A and 2B. It should be understood that main memory 106 includes the standard circuitry to apply the refresh signals to each row of memory storage elements in turn, allowing an entire memory module to be refreshed via the RAS and CAS signals, as is known to one of ordinary skill in the art.

The PCI devices 120 may include any of a variety of peripheral devices such as, for example, network interface cards, video accelerators, audio cards, network interface cards (NIC's), hard or floppy disk drives, Small Computer Systems Interface (SCSI) adapters and telephony cards. Although only two PCI devices 120 are included in the embodiment illustrated in FIG. 1 (in addition to the graphics controller 116), it should be recognized that computer system 100 may include any number of PCI devices as desired.

Referring still to FIG. 1, the graphics controller 116 controls the rendering of text and images on display 118. Graphics controller 116 may embody a typical graphics accelerator generally known in the art to render three-dimensional data structures on display 118. These data structures can be effectively shifted into and out of main memory 106. The graphics controller 116 therefore may be a master of the PCI bus 112 in that it can request and receive access to a target interface within the North bridge 104 to thereby obtain access to main memory 106. Display 118 is any electronic display device upon which an image or text can be represented. A suitable display 118 may include, for example, a cathode ray tube (CRT), a liquid display (LCD), a virtual retinal display (VRD), a thin-film transistor display (TFT), or any other type of suitable display device for a computer system.

Referring still to FIG. 1, a secondary bridge (or "South bridge") logic unit 122 also may be provided to accommodate an electrical interface to one or more peripheral devices 124 by way of an expansion bus 126. The expansion bus 126 may be implemented using any suitable bus type such as an Industry Standard Architecture (ISA) bus or an Extended Industry Standard Architecture bus (EISA). As the exemplary embodiment of FIG. 1 shows, expansion bus 126 is implemented as an ISA bus and, accordingly, peripheral device 124 represents an ISA device such as a fax/modem or sound card. Generally, South bridge 122 accommodates the transfer of data between buses 112 and 126. In addition to providing an interface to an ISA or EISA bus, South bridge 122 may further incorporate additional functionality, as desired. For example, in one embodiment, South bridge 122 includes a master PCI arbiter (not shown) for arbitrating ownership of the PCI bus 112. South bridge 122 may also incorporate an interrupt controller and power management support functionality.

Computer system 100 can be implemented with respect to the particular bus architectures shown in FIG. 1 (i.e., PCI and ISA buses), or other bus architectures, as desired. The embodiment described herein, however, assumes buses 112 and 124 represent a PCI and ISA buses, respectively, as shown in FIG. 1. Further, CPU 102 is assumed to be a Pentium® Pro processor and thus CPU bus 108 represents a Pentium Pro bus®. These bus protocols and the terminology used with respect to these protocols are well known to those of ordinary skill in the art. If a more thorough understanding of the PCI or Pentium® Pro buses is desired, reference should be made to the *PCI Local Bus Specification* (PCI Special Interest Group, 1993), *ISA System Architecture, Third Edition* (Addison Wesley, Inc., 1995), and *Intel P6 External Bus Specification*.

Computer system 100 also includes input/output (I/O) devices through which the user controls and operates the computer. An input/output controller (I/O controller) 130 preferably couples with ISA bus 126 to provide operational support for I/O devices such as a disk drive controller 129, a keyboard and mouse 128, and various serial and parallel ports 127, as desired. The I/O controller 130 further receives an activation signal 103 from suspend switch 101, which preferably is a momentary pushbutton switch (normally open) connected to ground. In alternative embodiments, suspend switch 101 may be a toggle switch, a single-pole, single-throw (SPST) switch, a rocker switch, or any other desired switch component. The use activates suspend switch 101 to generate a signal for the computer system 100 to enter suspend mode or any other low power mode in which the contents of main memory 106 are maintained through periodic refreshing as explained below. Resistor R1 connects between positive voltage rail $+V_{CC}$ (which preferably is at 5 volts) and activation signal 103 to maintain activation signal 103 at a voltage approximately equal to $+V_{CC}$ when suspend switch 101 is open (i.e. when the suspend switch 101 is not pressed and contacts 105 and 107 are not connected together). Suspend switch 101 preferably is mounted on the chassis of computer system 100 or other desired location and pressed by the computer user to initiate the suspend mode. In an alternative embodiment, pressing a key on the computer keyboard 128 activates suspend mode. The computer operating system may allow the user to initiate suspend mode, as well, through standard software interfaces or menus.

The I/O controller 130 further includes a real-time clock (RTC) 131 for event timing, generating interrupts, and other counting functions. The I/O controller 130 preferably includes an Intel 8251 device or other suitable controller. To synchronize the RTC 131, I/O controller 130 receives a timer clock signal from refresh timer 160, preferably at a rate of 32 kilohertz (kHz), where one Hertz equals one cycle per second of a periodic waveform.

Refresh logic 150 couples to bridge logic unit 104 via a refresh signal which is suitable for refreshing main memory 106 in place of the RAS memory signal during suspend mode, as will be discussed below. Refresh logic 150 further receives a select signal from the CPU 102, which may be asserted to change the nature of the refresh signal, as will be explained below with respect to the embodiment of FIG. 5. Refresh logic 150 also receives the timer signal from refresh timer 160, for synchronization and timing purposes, as will be explained in more detail with respect to FIGS. 3A, 4, 5, and 7.

Clock generators 140, 142, and 144 provide timing signals to the CPU 102, bridge logic unit 104, and secondary bridge logic unit 122, respectively. The timing signals 141, 143, and 145 preferably oscillate regularly at a rate of 66 megahertz (MHz), or 66 million cycles per second, and serve to synchronize operations within CPU 102, bridge logic unit 104, and secondary bridge logic unit 122, respectively, as would be understood by one of ordinary skill in the art. The CPU 102, North bridge logic 104, and South bridge logic 122 generally freeze all operations if the clock generators 140, 142, and 144 stop operating. Accordingly, clock generators 140, 142, and 144 receive the suspend signal from I/O controller 130 and stop oscillating if suspend is asserted.

Thus, when suspend switch 101 is closed by the user, activation signal 103 is pulled to ground voltage, and I/O controller 130 then generates a suspend signal to suspend system operation. During suspend mode, power preferably is cut off to all peripheral devices including hard and floppy disk drives, CD ROM drives, PCI devices (including the graphics controller 116 and display 118), ISA devices, and devices coupled to serial or parallel ports. As will be described in more detail below, the I/O controller and refresh logic 150 remain powered in order to refresh main memory 106. Thus, only the I/O controller 130, the refresh logic 150, and main memory 106 receive power from the battery during suspend mode.

Figure 2A:
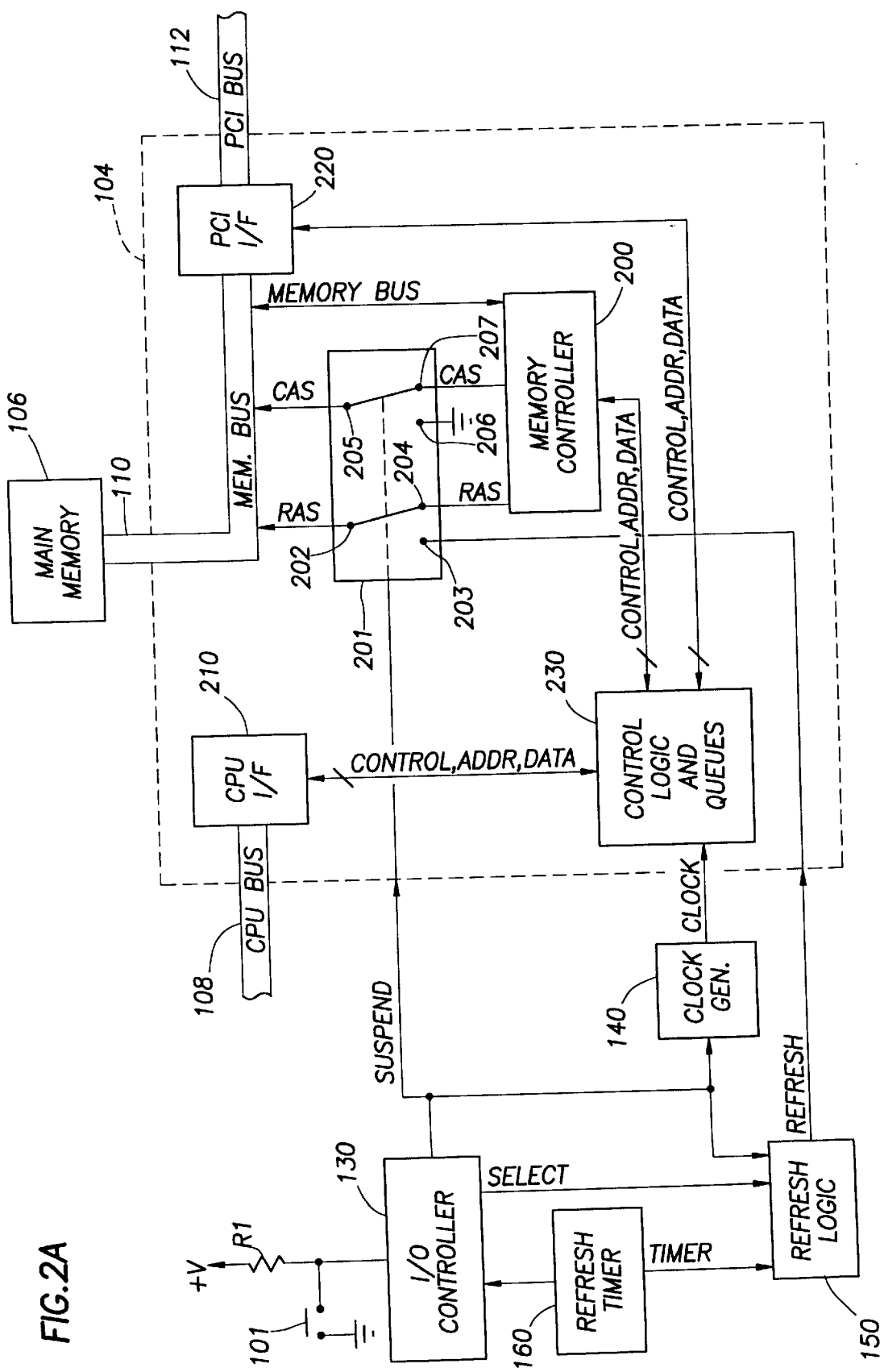
FIG. 2 illustrates a block diagram of a preferred embodiment of the bridge logic unit of FIG. 1.

Referring now to FIG. 2A, the North bridge logic 104 generally includes a memory controller 200 coupled to the memory bus 110, CPU interface 210 coupled to the CPU bus 108, a PCI interface 220 coupled to the PCI bus 112, and control logic and queues 230 which connect to the memory controller 200, CPU interface 210, and PCI interface 220 via control, address, and data signals. North bridge 104 also includes switch 201 which couples the row address strobe (RAS) and column address strobe (CAS) signals to the memory bus 110.

The control logic and queues 230 receives transaction requests between the buses 108, 110, and 112 through the control, address, and data signals. Transaction requests represent requests to transfer data from one bus to another. The bridge logic unit 104 also changes switch 201, which receives the RAS and CAS signals from the memory controller 200 and the refresh signal from refresh logic 150. Switch 201 selects either RAS and CAS or refresh and ground, respectively, to send to the memory bus 110, according to the state of suspend signal, as explained below.

Output terminals 202 and 205 of switch 201 couple to the RAS and CAS signals, respectively, on the memory bus 110. Output terminal 202 preferably connects to input terminal 203 (refresh) when suspend is asserted or to input terminal 204 (RAS from memory controller 200) when suspend is not asserted. Similarly, output terminal 205 connects to input terminal 206 (ground) when suspend is asserted or to input terminal 207 (CAS from memory controller 200) when suspend is not asserted. Accordingly, switch 201 couples the RAS signal on the memory bus 110 either to the refresh signal (when suspend is asserted) or to the RAS signal produced by the memory controller 200 (when suspend is not asserted). Switch 201 further couples the CAS signal on the memory bus 110 either to ground (when suspend is asserted) or to the CAS signal produced by the memory controller 200 (when suspend is not asserted).

Generally, queue storage elements (not shown) contained in the control logic and queues 230 allow data and data transaction requests (such as CPU reads and writes to memory, PCI reads and writes to memory, and other requests) to be temporarily stored pending execution by the destination device, thereby permitting the requesting device to perform other tasks until its transaction request is completed. Operation and storage of data transactions in the queue storage elements preferably occurs concurrently, allowing data and data transaction requests among the interfaces 210, 220 and the memory controller 200 to be stored concurrently within the North bridge 104. Concurrent storage of data and transaction requests in the queue storage elements means that each queue storage element can hold data and/or transaction requests at the same time that some or all other queue storage elements also hold data and transaction requests.

Memory controller 200 transmits data and addresses to and from main memory 106 by asserting column address strobe (CAS), row address strobe (RAS), and other memory bus signals to main memory 106 via the memory bus 110. The other memory bus signals (not explicitly depicted in FIG. 2A) typically include data mask (DQM), chip select (CS), clock enable (CKE), write enable (WE), bank address (BA), output enable (OE), and address (ADDR) signals, as are well known to those of ordinary skill in the art. The memory controller 200 receives address signals from the queues and from the CPU interface 210 and PCI interface 220, which indicate the memory addresses of data to be written to main memory 106. Accordingly, the memory controller 200 uses the CAS, RAS, and other memory bus signals to encode the memory addresses to be transmitted over the memory bus 110. For a more compete description of memory cycles and other transactions of the bridge logic device 104, reference may be made to co-pending and commonly assigned application entitled "Computer System with Memory Controller and Bridge Interface Permitting Concurrent Operation," incorporated herein by reference.

As explained previously, the DRAM modules in main memory 106 must be refreshed at periodic time intervals to prevent the memory data, which is stored in the DRAM using electrically charged capacitors, from being lost. Further, DRAM preferably is refreshed at all times while the computer system 100 is in operation, including normal operation, suspend mode, sleep mode, or any other mode of operation. Accordingly, the DRAM modules main memory 106 must receive at least 32,000 refresh pulses per second (i.e., a refresh rate of 32 kHz) in a preferred embodiment. One of ordinary skill in the art would immediately recognize how to apply the principles of the present invention to refresh DRAM modules requiring normal refresh rates greater or less than 32 kHz, however. Accordingly, the principles of the present invention should not be construed as limited to any specific normal refresh rate.

In fact, because each row of main memory 106 must be refreshed within a certain minimum time interval, the required refresh rate depends on the number of rows in the DRAM module being refreshed. As discussed above, each refresh pulse preferably is applied to one row within a DRAM module. If the DRAM module has 512 rows and if each row must receive a refresh signal every 16 milliseconds (ms), then the minimum refresh rate is 512/16 ms=32 kilohertz (kHz). As one of ordinary skill in the art would realize, different DRAM chips may incorporate different numbers of rows and require different refresh periods for each row. Hence, a similar DRAM module containing only 256 rows but also requiring a refresh signal every 16 ms would have a minimum refresh rate of 256/16=16 kHz. Therefore, it is possible to lower the rate of the refresh signal to a DRAM module without changing the rate at which any given bit in that modules is refreshed. It should be recognized that the focus of the present invention is directed toward lowering the rate at which any particular bit of memory is refreshed, however, since the rate at which a given bit is refreshed determines the power consumed during refreshing.

Hence, all forthcoming terms that denote the minimum time period or frequency required for refreshing memory, such as "refresh rate," "refresh frequency," or "refresh period," for example, should be interpreted as referring to the rate (frequency) or period of the refresh (or RAS) signal, and not to the rate or time interval required for refreshing a single DRAM storage element (or bit), unless specifically noted. This terminology is intended to clarify the distinction between the rate of the refresh signal and the bit refresh rate and is not intended to limit the present invention from reducing the rate at which memory bits are refreshed. Because the embodiments described herein generally disclose a fixed number of rows in main memory, however, lowering the rate of the refresh signal corresponds to lowering the refresh rate of any given bit.

During low power modes, the present invention advantageously refreshes memory at a slower rate than during normal operation. It has been determined that DRAM can be refreshed at slower rates as the temperature of the DRAM decreases, which generally occurs during a low power mode when many of the computer components are turned off. By refreshing memory at slower rates, the computer system uses less power, prolonging the life of the battery.

Figure 2B:
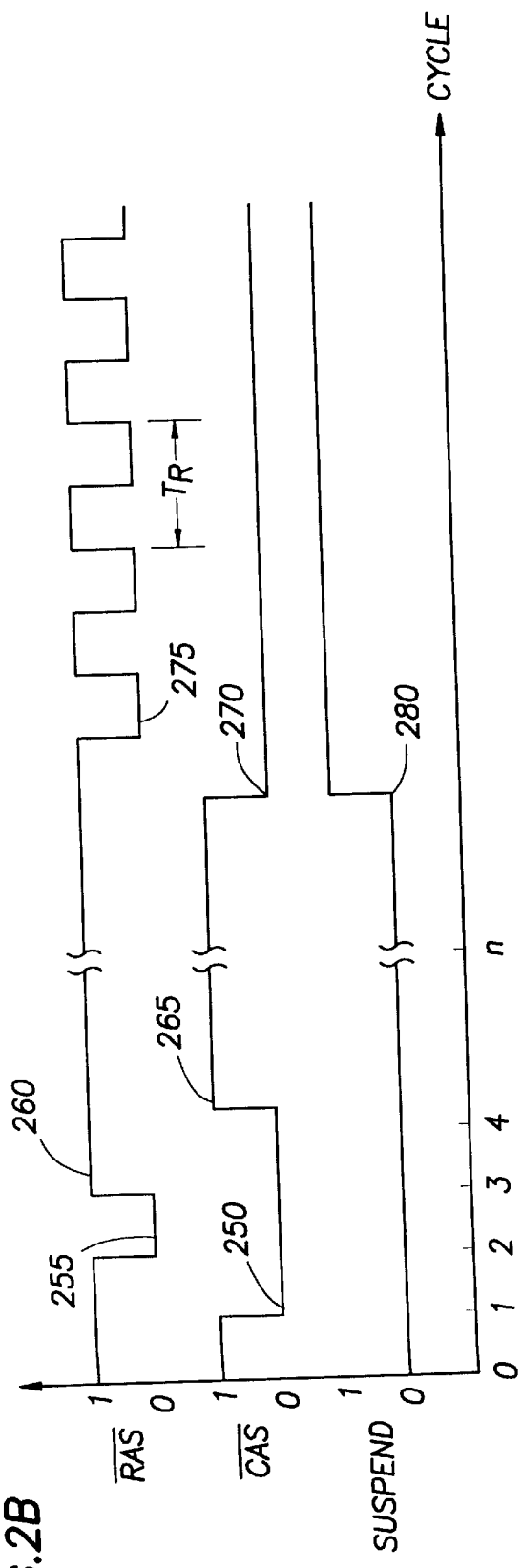

The bridge logic unit 104 preferably refreshes the main memory 106 at the appropriate times via the memory bus 110. To initiate normal read and write transactions with main memory 106, the standard sequence of memory bus 110 signals involves asserting the RAS signal before the CAS signal. When the RAS signal follows the CAS signal, however, the main memory 106 undergoes a refresh cycle. FIG. 2B illustrates the "CAS before RAS" sequence normally used by the memory controller 200 for refreshing memory. CAS and RAS are preferably active low signals, or signals that are considered to be "asserted" when in the "low" (or "0") state and considered to be "deasserted" when in the "high" (or "1") state. Before the memory controller 200 initiates the refresh cycle, the CAS and RAS signals are deasserted (cycle 0), or in the "1" state (cycle 0).

As illustrated in FIG. 2B, the memory controller 200 begins asserting the refresh command in cycle 1 by asserting CAS (point 250). After CAS is asserted, the memory controller 200 asserts RAS (point 255). Subsequently, RAS and CAS are deasserted at points 260, and 265, respectively, and the memory refresh command is complete. Main memory 106 responds to this sequence of RAS and CAS signals by initiating a refresh cycle to recharge its DRAM modules.

Referring again to FIG. 2A, when suspend is not asserted (i.e., the computer is not in the suspend mode), memory controller 200 issues refresh commands at the appropriate times. When suspend is asserted by the I/O controller 130 in response to suspend switch 101 being activated, however, switch 201 changes to the alternative state from that shown in FIG. 2A. As such, CAS is grounded on the memory bus 110, and the refresh logic 150 controls RAS via the refresh signal. During suspend mode, however, the bridge logic 104, and thus the memory controller 200, is prevented from operating normally by the suspend signal. Because switch 201 is actuated by the suspend signal, the refresh logic 150 provides a continuous sequence of refresh commands to main memory 106 when the memory controller 200 is disabled. When suspend is deasserted, the memory controller 200 asserts RAS and CAS to refresh memory. When suspend is asserted, however, the refresh logic 150 controls memory refresh via the refresh signal.

FIG. 2B illustrates the repeated sequence of refresh commands received by main memory 106 during suspend mode. At cycle n, the suspend signal is asserted (point 280), grounding (and therefore asserting) CAS (point 270). Next, the refresh logic 150 at point 275 begins toggling (or pulsing) RAS repeatedly. Because CAS was asserted at point 270 before RAS was asserted at point 275, main memory 106 interprets each RAS pulse after point 270 as a refresh command. By continuing to provide a refresh signal with a variable pulse period $T_R$, where $T_R$ is the desired refresh period of main memory 106, refresh logic 150 maintains the contents of main memory 106 data during the suspend mode. By adjusting the variable pulse period $T_R$ as described below, the present invention can continue to refresh memory at the lowest possible rate during suspend mode, using the least amount of power possible.

After the computer system 100 enters suspend mode, the disabled components of the computer stop drawing power. Because these disabled components are not consuming energy, they stop dissipating heat, and the computer system 100 begins to cool. In addition, the refresh cycles tend to generate very little heat, and the temperature inside the computer system 100 may fall to room temperature. Because of the nature of DRAM memory chips, the rate at which charge leaks from the storage capacitors varies according to the temperature of the DRAM modules. In fact, the charge leakage rate tends to fall as the DRAM temperature becomes cooler. Thus, after suspend mode begins and the memory temperature falls, the refresh rate or frequency $f_r$, which is the inverse of the pulse duration $T_r$, may be decreased without incurring data loss in main memory 106. Preferably, the refresh frequency $f_r$ may be halved for every 10 degree Celsius (° C.) decrease in temperature without risking memory loss, although some DRAM modules may require slightly different refresh rates. In alternative embodiments, the refresh frequency $f_r$ may be reduced by a factor of m for every p degree decrease in the DRAM temperature, where the numbers m and p are adjusted as desired.

The power dissipated in main memory 106 during memory refresh is directly proportional to the refresh frequency $f_r$. Therefore, any change in the refresh frequency $f_r$ of the refresh signal produces a proportional change in the power consumed by main memory 106, and the rate of energy drain on the computer battery may be reduced by decreasing the refresh frequency $f_r$ during suspend mode. Accordingly, the refresh logic 150 varies the refresh frequency $f_r$ of the refresh signal as the temperature drops. Immediately after suspend mode is invoked, refresh logic 150 provides the refresh signal at the normal rate by the DRAM during normal operation (i.e. 32 kHz). For each 10° C. decrease in temperature of main memory 106 thereafter, the pulse duration $T_r$ is doubled. Alternatively stated, the refresh frequency $f_r$ is cut in half for every 10° C. decrease in temperature.

In alternative embodiments based on the apparatus of FIG. 2A, the refresh logic 150 may be incorporated into bridge logic device 104 or into any other suitable device without substantively departing from the principles of the invention. While the prior and forthcoming descriptions treat refresh logic 150 as a distinct component in computer system 100, refresh logic 150 generally should not be limited as such.

Figure 3B:
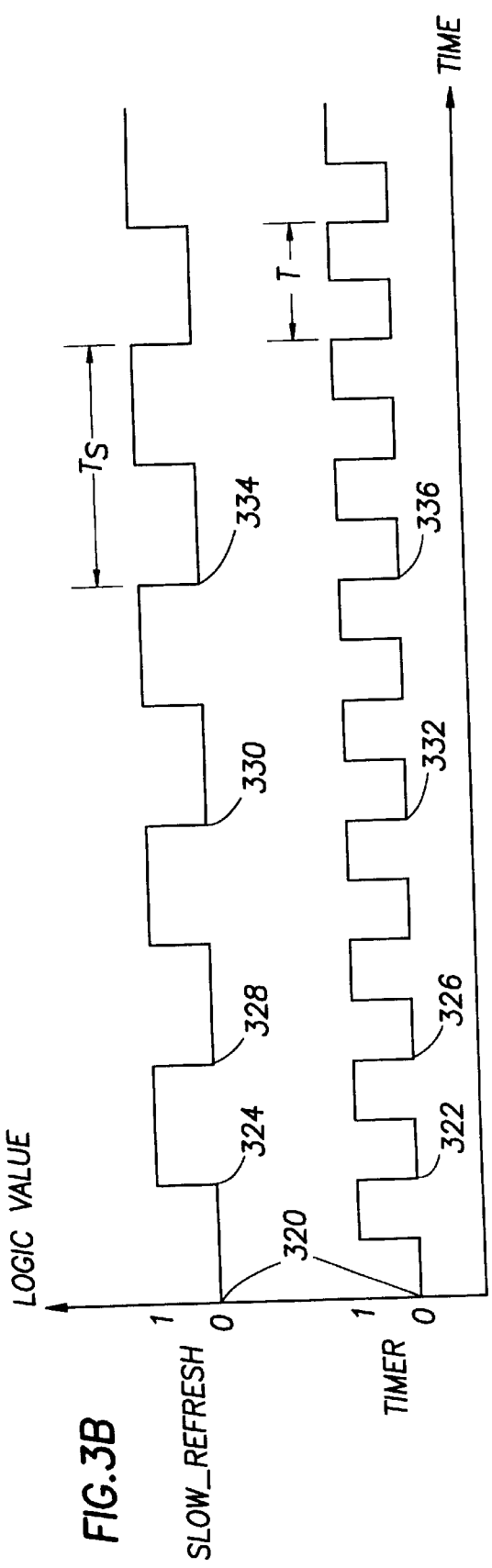
FIG. 3B illustrates a timing diagram of the output signal from the divide-by-two unit of FIG. 3A.
Figure 3A:
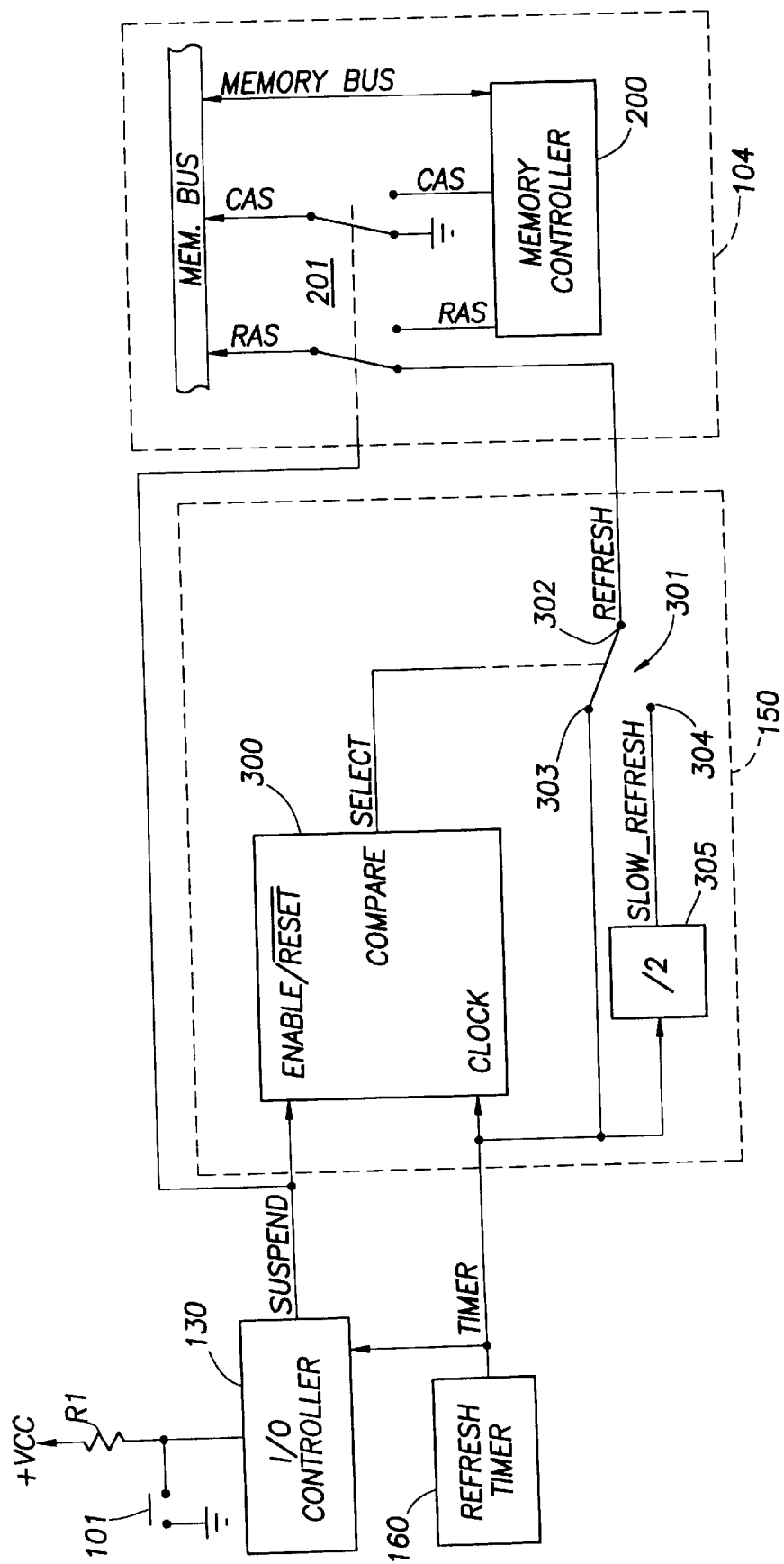
FIG. 3A illustrates a block diagram of a preferred embodiment of the refresh logic of FIG. 1.

FIG. 3A illustrates a preferred embodiment of refresh logic 150, including counter 300, switch 301, and divide-by-two unit 305. The counter 300 receives the suspend and timer signals from the I/O controller 130 and refresh timer 160, respectively, and generates a select signal to control the state of switch 301. As will be described in greater detail below, counter 300 is programmed to assert the select signal after a predetermined period of time during suspend mode at which the main memory is expected to have cooled and can accommodate a slower refresh signal. Divide-by-two unit 305 also receives the timer signal from refresh timer 160, producing the slow_refresh signal, a signal having one-half the rate of the timer signal and used to refresh memory during suspend mode. In response to the state of the select signal, switch 301 selects the refresh signal from terminal 302 as either the timer signal (from counter 300) or as the slow_refresh signal (from divide-by-two unit 305), based on the state of the select signal. Accordingly, terminal 303 receives the timer signal, while terminal 304 receives the slow_refresh signal. When counter 300 asserts the select signal, terminal 302 connects to terminal 304, and the refresh signal is generated by the slow_refresh signal. When counter 300 deasserts the select signal, terminal 302 connects to terminal 303, and the refresh signal is generated by the timer signal.

The timer signal, generated by refresh timer 160, provides a synchronization signal to counter 300 via the "clock" input terminal. The suspend signal, generated by I/O controller 130, couples to the "enable/reset" input terminal of counter 300 to initiate counter operation. When the suspend signal is deasserted, counter 300 preferably resets to a predetermined value $T_C$ that corresponds to the length of time required for main memory 106 to decrease in temperature by 10° C. during suspend mode. $T_C$ preferably corresponds to one hour, although $T_C$ may vary for different embodiments of computer system 100. In general, $T_C$ may be optimized by measuring the temperature of the main memory 106 during suspend mode and recording the time required for the temperature to decrease by 10° C. from the main memory temperature during normal computer operation.

FIG. 3B illustrates an exemplary timing diagram of the timer and slow_refresh signals. As shown in FIG. 3B, slow_refresh has a frequency that is one-half of the frequency of the timer signal. Both timer and slow_refresh begin in the "low," or "0," state (point 320). The timer signal, illustrated as a periodic square wave, completes a first cycle at point 322. Concurrently with the end of the first timer cycle at point 322, slow_refresh toggles to the "1" state (point 324). Concurrently with the end of the second timer cycle (point 326), slow_refresh completes its first cycle by toggling back to the "0" state (point 328). In this manner, slow_refresh appears as a periodic square wave with one cycle for every two timer cycles. For example, the end of the second slow_refresh cycle (point 330) occurs concurrently with the end of the fourth timer cycle (point 332), while the end of the third slow_refresh cycle (point 334) occurs concurrently with the end of the sixth timer cycle (point 336). Accordingly, the pulse period of slow refresh, $T_S$, is twice the pulse period of timer (T), i.e., slow_refresh changes at half of the rate of the timer signal.

Referring again to FIG. 3A, when the suspend signal is asserted, forcing the computer system 100 into suspend mode, counter 300 begins counting downward from $T_C$ to zero. Preferably, the timer signal synchronizes counter 300 to ensure that counter 300 counts at the proper rate, reaching zero at time $T_C$. At the same time, the select signal provided by counter 300 is deasserted so that the state of switch 301 connects input terminal 303 to output terminal 302, so that the refresh signal is provided directly by the timer signal. When counter 300 finishes counting to zero, indicating that time $T_C$ has elapsed and the main memory 106 has cooled enough to be refreshed at a slower rate, counter 300 asserts the select signal to cause switch 301 to change states so that the slow_refresh signal provides the refresh signal. Once asserted, the select signal preferably remains asserted until the suspend signal is deasserted. When the suspend signal is deasserted, even if the time $T_C$ has not elapsed, then counter 300 stops counting, deasserts the select signal, and resets its count value to $T_C$. Thus, if $T_C$ is one hour, for example, the memory is refreshed at the standard refresh rate, preferably 32 kHz, for the first hour. After the first hour has elapsed, switch 301 selects a slower refresh rate as slow_refresh from the divide-by-two unit 305. Because slow_refresh provides a refresh signal that is one-half of the frequency of the timer signal, the power consumed by main memory 106 after the first hour elapses is decreased by one-half, as compared to the power consumed by main memory 106 prior to the first hour.

The count value $T_C$ preferably is one hour but may any desired amount of time corresponding to the time at which main memory 106 is expected to cool to a predetermined temperature. Also, a divide-by-n unit, where n is any desired number greater than one, may be substituted for divide-by-two unit 305. A divide-by-n unit in such an embodiment would provide an output signal with a pulse width (or pulse period) of $$\frac{1}{nf_R},$$

where $f_R$ is the frequency of the timer signal. Appropriate values of $T_C$ and n may be determined using the general guideline that the refresh rate decreases by one-half for every 10° C. decrease in temperature of main memory 106. Thus, if the standard operating temperature of main memory 106 is 70° C. and the standard refresh rate is 32 kHz, then $T_C$ is determined as the time required for main memory 106 to reach 60° C. or less during suspend mode. After time $T_C$ has elapsed, the refresh rate may be set to 32 kHz/2=16 kHz. Alternatively, $T_C$ may be set to the time required for main memory 106 to reach any desired temperature threshold, such as 50° C., for instance, during suspend mode. If the desired temperature threshold is 50° C., then the refresh rate may be set to 32 kHz/4=8 kHz after $T_C$ elapses. Time $T_C$ may be estimated or determined empirically by tracking the temperature of main memory 106 and recording the time required for main memory 106 to reach the desired temperature.

Figure 4A:
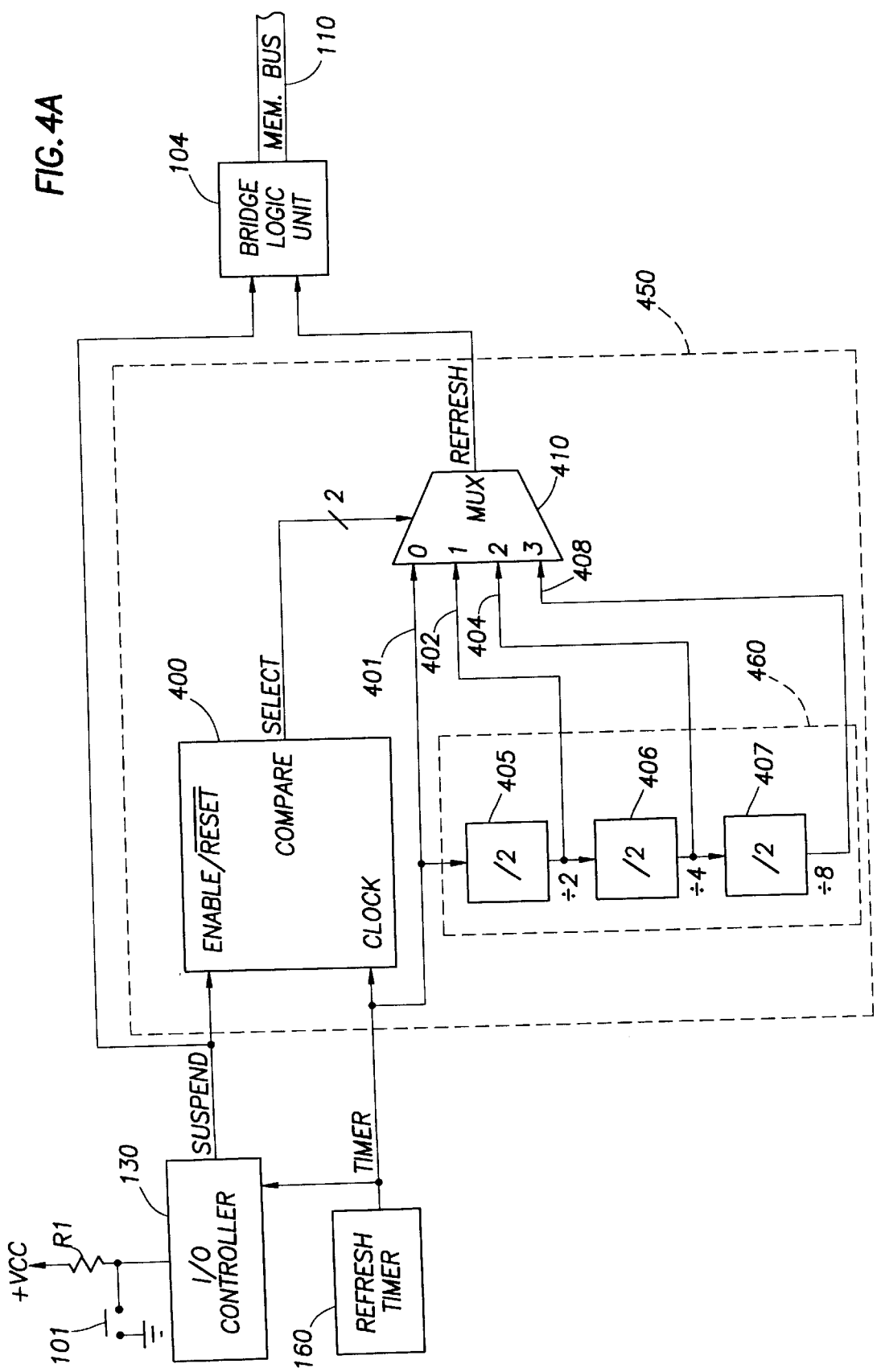
FIG. 4A illustrates a block diagram of an alternative embodiment of the refresh logic of FIG. 1 with multiple refresh frequencies.

FIG. 4A illustrates an alternative embodiment of the present invention in which refresh logic 450 includes counter 400, frequency divider 460, and multiplexer 410. Frequency divider 460 comprises divide-by-two units 405, 406, and 407. It should be noted, however, that frequency divider 460 may comprise any number of divide-by-two units as desired. Counter 400 receives the suspend and timer signals from the I/O controller 130 and refresh timer 160, respectively, and counts in substantially the same manner as counter 300 in the embodiment of FIG. 3A. In contrast with counter 300, however, counter 400 generates two select signals to be used as control signals for multiplexer 410. If frequency divider 460 includes more than three divide-by-two units, then counter 400 preferably generates a sufficient number of select signals to select between the various output signals provided by the divide-by-two units and the timer signal via multiplexer 410, as described below. Accordingly, multiplexer 410 should include enough input terminals to accommodate the timer signal as well as the output signals from the divide-by-two units.

Divide-by-two unit 405 receives the timer signal from refresh timer 160, providing output signal 402 having one-half the frequency of the timer signal. Output signal 402 feeds input terminal "1" of multiplexer 410 and also provides an input signal for divide-by-two unit 406. Accordingly, divide-by-two unit 406 provides an output signal 404 having one-half of the frequency of output signal 402 from divide-by-two unit 405. Thus, the output signal 404 from divide-by-2 unit 406 is a signal with a frequency of one-fourth of the frequency of the timer signal. Similarly, output signal 404 from divide unit 406 feeds input terminal "2" of multiplexer 410 as well as the input terminal of the third divide-by-two unit 407. Divide-by-two unit 407 produces an output signal 408 having one-half of the frequency of the output signal 404 from divide-by-two unit 406. Accordingly, the output signal 408 from divide-by-two unit 407 has a frequency that is one-eighth the frequency of the timer signal. Through input terminal "3," multiplexer 410 receives the output signal 408 provided by divide-by-two unit 405. Multiplexer 410 also receives the timer signal (401) at input terminal "0." Thus, multiplexer 410 receives a set of periodic timing signals 401, 402, 404, and 408, each having a different frequency.

Figure 4B:
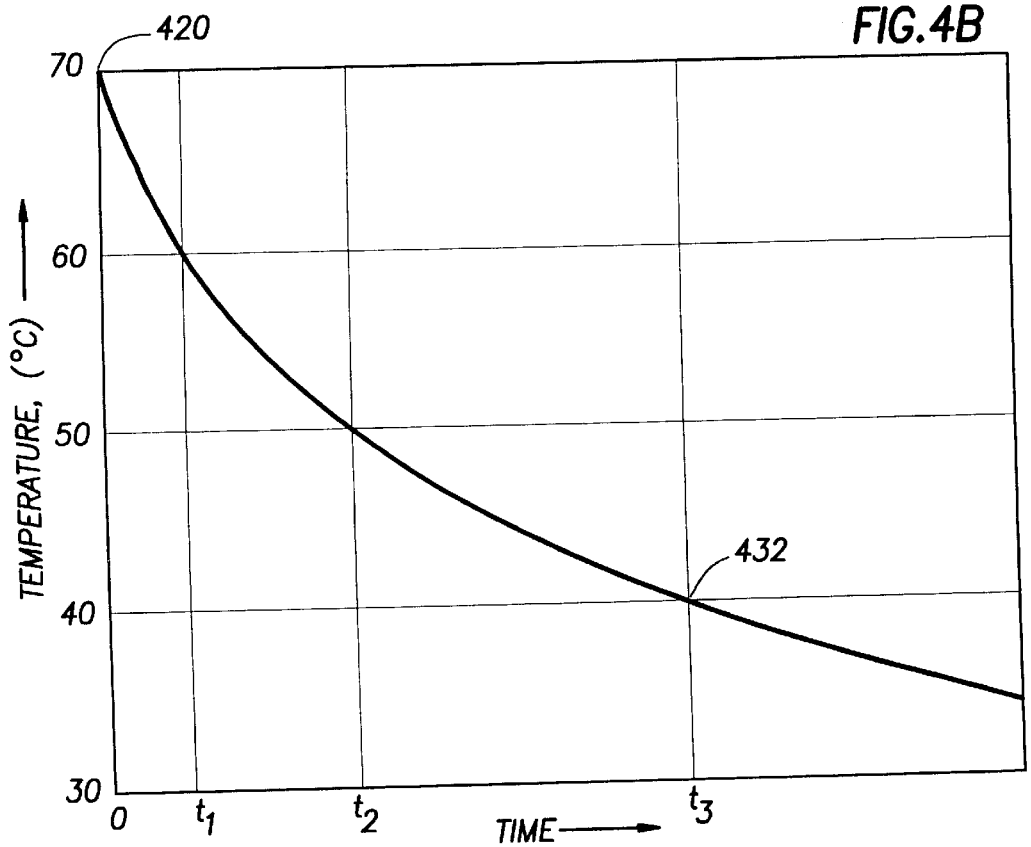
FIG. 4B illustrates a graph of the temperature of a memory device during suspend mode as a function of time.

Multiplexer 410 may select one of the timing signals 401, 402, 404, and 408 as the refresh signal on its output terminal according to the expected temperature of main memory 106. As noted above, the expected temperature of main memory 106 as a function of time during suspend mode may be estimated or determined empirically. FIG. 4B illustrates an exemplary graph of memory temperature vs. time for computer system 100 during suspend mode. On the graph of FIG. 4B, computer system 100 enters suspend mode at time t=0, when the temperature of main memory 106 is approximately 70° C. (point 420). During suspend mode, the temperature of main memory 106 gradually decreases over time, eventually reaching 40° C. at time t=$t_3$ (point 432). Between time t=0 and time t=$t_3$, main memory temperature drops below (or "surpasses") the 60° C. threshold at time t=$t_1$ (point 424) and passes 50° C. at time t=$t_2$.

Following the general rule that the refresh rate may be decreased by a factor of two for every 10° C. decrease in temperature, it follows that, after time t=$t_1$, main memory 106 may be refreshed at one-half of the standard refresh rate without incurring memory loss. Further, main memory 106 may be refreshed at one-fourth of the standard refresh rate after time t=$t_2$ and at one-eighth of the standard refresh rate after time t=$t_3$. Referring again to FIG. 4A, predetermined times $t_1$, $t_2$, and $t_3$ are programmed into counter 400 such that the select signals select the proper input signal of multiplexer 410 to be the refresh signal having the minimum acceptable frequency for refreshing memory.

As in the previous embodiment, counter 400 is synchronized by the timer signal and begins counting when suspend is asserted. In the present embodiment, counter 400 begins counting upward from zero, with the select signal encoded to select the timer input signal to multiplexer 410. Thus, main memory 106 is initially refreshed at the standard refresh rate during suspend mode. When the suspend signal is deasserted, counter 400 stops counting and resets to zero. If count reaches the value corresponding to time t=$t_1$, however, then counter 400 changes the select signal to select input signal 402 as the refresh signal from multiplexer 410. Accordingly, the refresh signal is provided at one-half the standard refresh rate by divide-by-two unit 405, and the power consumed by main memory 106 decreases by half.

When counter 400 reaches the value corresponding to time t=$t_2$, the select signal changes to select input signal 404 as the refresh signal from multiplexer 410, changing the refresh rate to one-fourth of the standard rate. Since the temperature of main memory 106 is expected to drop at least 20° C. below the standard operating temperature, or to 50° C. in this example, main memory 106 may be safely refreshed at one-fourth the standard refresh rate. Thus, main memory 106 generally consumes only one-fourth of the power after time t=$t_2$ as it consumed at the beginning of suspend mode. Further, when counter 400 reaches the value corresponding to time $t_3$, the select signal changes to select input signal 408 as the refresh signal from multiplexer 410, changing the refresh rate to one-eighth of the standard rate, resulting in an eight-fold savings in power consumption.

Alternatively, the divide-by-two units within frequency divider 460 may be replaced with units which divide an input frequency by any number greater than zero. For instance, divide-by-two units 405, 406, and 407 may be replaced by a divide-by-n unit, a divide-by-k unit, and a divide-by-m unit, respectively, where n, k, and m are numbers greater than zero. The resulting apparatus would be capable of selecting a refresh signal from the set of frequencies $$\left\{ f, \frac{f}{n}, \frac{f}{nk}, \frac{f}{nkm} \right\},$$

where f is the standard refresh frequency used prior to suspend mode. Divide-by-two units are preferred, however, because the circuitry needed to implement a divide-by-two frequency divider is generally much simpler than the circuitry necessary for a frequency divider that does not divide the frequency by a multiple of two, as one of ordinary skill in the art will understand.

Figure 5:
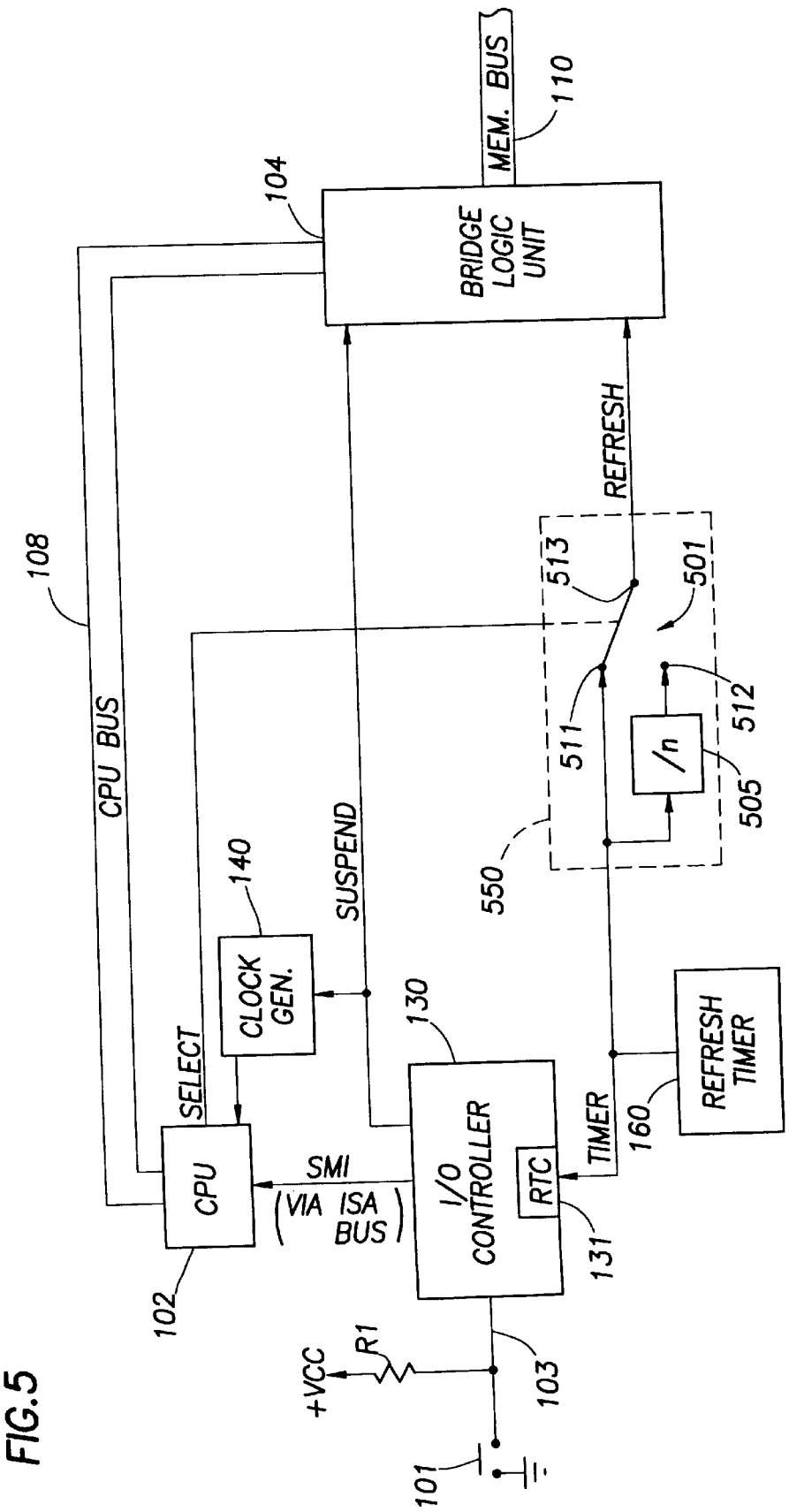
FIG. 5 illustrates a block diagram of an alternative embodiment of the refresh logic of FIG. 1 in which the processor selects the refresh frequency.

Now turning to FIG. 5, another alternative embodiment of the present invention uses the CPU 102 to adjust the refresh rate during the suspend mode. As shown in FIG. 5, refresh logic 550 comprises a divide-by-n unit 505 and switch 501. The I/O controller 130 responds to the activation of suspend switch 101 by asserting the suspend signal to clock generator 140 and to the bridge logic unit 104, to indicate that the system is in suspend mode. The I/O controller 130 also sends system management interrupt (SMI) signals to the CPU 102 via the ISA bus 126, although FIG. 5 illustrates the SMI signals coupled directly to the CPU for purposes of clarity. As in previous embodiments, clock generator 140 provides a synchronization signal 141 to the CPU 102, and refresh timer 160 provides the timer signal to the Real-Time Clock (RTC) 131 of I/O controller 130 and to the refresh logic 550.

The RTC 131 is a clock/counter device capable of measuring the current time of the computer system. The I/O controller 130 can read the time value of the RTC 131 to service requests by other devices in the computer system 100 or to generate interrupt signals at specific times via the SMI signals. The SMI signals operate as standard interrupt signals which are sent by the I/O controller 130 through the ISA bus 126 (not shown) to transmit immediate messages to devices such as the CPU 102.

Now referring directly to the refresh logic 550, divide-by-n unit 505 receives the timer signal from the refresh timer 160 and provides an output signal to terminal 512 of switch 501 which has a pulse duration n times that of the timer signal. Switch 501 receives a second input signal from the timer signal at terminal 511 and generates a refresh signal (at terminal 513) to the bridge logic unit 104, depending on the state of the switch. The state of switch 501 is determined by the select signal, which is received from the CPU 102. Thus CPU 102 sets the refresh rate by controlling the state of switch 501. Accordingly, when the select signal is not asserted, then switch 501 selects the timer input signal, as shown, from terminal 511, and the refresh signal is driven by the timer signal. If the select signal is asserted by the CPU 102, however, then switch 501 selects the output signal of divide-by-n unit 505, and the refresh signal is generated with a pulse period that has n times the pulse period of timer. In the preferred embodiment, n preferably is 2, although n may be any desired number greater than one.

When the system is placed into suspend mode via suspend switch 101, I/O controller 130 asserts the suspend signal, which causes the CPU 102 and bridge logic 104 to cease operation, along with the remaining devices in computer 100 (not shown). Only I/0 controller 130, refresh timer 160, refresh logic 550, and main memory 106 remain active during suspend mode. Once in suspend mode, the temperature of the main memory 106 is expected to surpass (i.e., to fall below) a predetermined temperature threshold over time. Accordingly, at a predetermined time period during suspend mode, the CPU 102 preferably signals the refresh logic 550 (via the select signal) to decrease the refresh rate by a factor of n. Preferably, the CPU 102 reduces the refresh rate after one hour, however the CPU 102 could easily be programmed for another time period as well.

Because the CPU 102 is idle during suspend mode, however, it is incapable of determining when one hour has elapsed. Therefore, I/O controller 130 monitors the state of the Real-Time Clock 131, after suspend mode commences. When the value of the RTC 131 indicates that the predetermined wait time (preferably one hour) has passed, the I/O controller 130 wakes up computer system 100 by deasserting the suspend signal. Immediately after the computer system 100 begins operating, I/O controller 130 transmits an SMI signal to the CPU 102 to direct the CPU 102 to reduce the refresh rate. In response to the SMI, the CPU 102 asserts the select signal, which slows the frequency of the refresh signal by a factor of n. After the refresh logic 550 begins refreshing memory at the slower rate, the I/O controller 130 then reasserts the suspend signal to again shut down the computer system 100. Afterward, the main memory 106 receives a refresh signal whose frequency is reduced by a factor of n, resulting in power savings proportional to n.

As an alternative to the single divide-by-n unit 505 in FIG. 5, refresh logic 550 may include a plurality of divide-by-n units which are coupled in substantially the same manner as the divide-by-2 units 405, 406, and 407 of FIG. 4A. A multiplexer will replace switch 501 to receive the select signal from the CPU 102 to select the refresh rate. The select signal may comprise two or more levels depending on the number of input signals to the multiplexer. In this alternative embodiment, the I/O controller 130 monitors the RTC 131 for times $t_1$, $t_2$, and $t_3$, at which the refresh rate may be stepped down. As in previous embodiments, these times $t_1$, $t_2$, and $t_3$ correspond to the times at which the memory temperature is expected to surpass a set of predetermined temperature thresholds. At times $t_1$, $t_2$, and $t_3$, the I/O controller 130 wakes up the system by deasserting suspend and generates an SMI to the CPU 102 indicating that the refresh rate may be decreased. The CPU 102 responds to the SMI by changing the refresh rate in the refresh logic 550 via the select signals. Accordingly, the refresh logic 550 may provide a variety of refresh rates, via the divide-by-n units, to refresh memory at successively slower rates during the suspend mode. It can be shown that this embodiment provides a more power-efficient refresh signal than do embodiments with only two refresh rates.

For other alternative embodiments, an optimal refresh rate may be defined mathematically. As stated previously, the refresh rate of main memory 106 can generally be reduced from the standard refresh rate by a factor of 2 for every 10° C. that the memory temperature drops below the normal operating temperature. The mathematical relationship between minimum refresh rate and memory temperature is thus generally characterized by equation (1):

$$f_R(T) = f_R(T_0) * 2^{\frac{T-T_0}{10}} \text{ Hz} \quad (1)$$

where T is the temperature of main memory 106 in degrees Celsius (° C.), $f_R(T)$ is the minimum required refresh rate when the memory 106 is at temperature T, $T_0$ is the normal operating temperature of main memory 106 in degrees Celsius (° C.), $f_R(T_0)$ is the standard refresh rate for main memory 106 under normal operating temperature $T_0$. At normal operating temperature, or when $T=T_0$, the exponent in equation (1) is zero, and the minimum required refresh rate is thus the standard refresh rate $f_R(T_0)$. For every 10° C. decrease in operating temperature, the exponent of equation (1) decreases by one. Thus, at 10° C. below normal operating temperature, or at $T=T_0-10$, the minimum required refresh rate is thus the standard rate $f_R(T_0)$ multiplied by ½. Similarly, at 20° C. below normal operating temperature, or at $T=T_0-20$, the minimum required refresh rate is thus the standard rate $f_R(T_0)$ multiplied by ¼. As one of ordinary skill in the art would understand, the number "10" in the denominator of the exponent of equation (1) represents the doubling rate of the refresh frequency, or the change in degrees Celsius that causes the required refresh frequency to double (i.e., 10° C. in the preferred embodiment). For example, if the doubling rate of the temperature/frequency relationship dictated that the refresh frequency may be cut in half for a decrease of 5° C. (instead of a decrease of 10° C.), the exponent denominator in equation (1) would change from "10" to "5."

Figure 6:
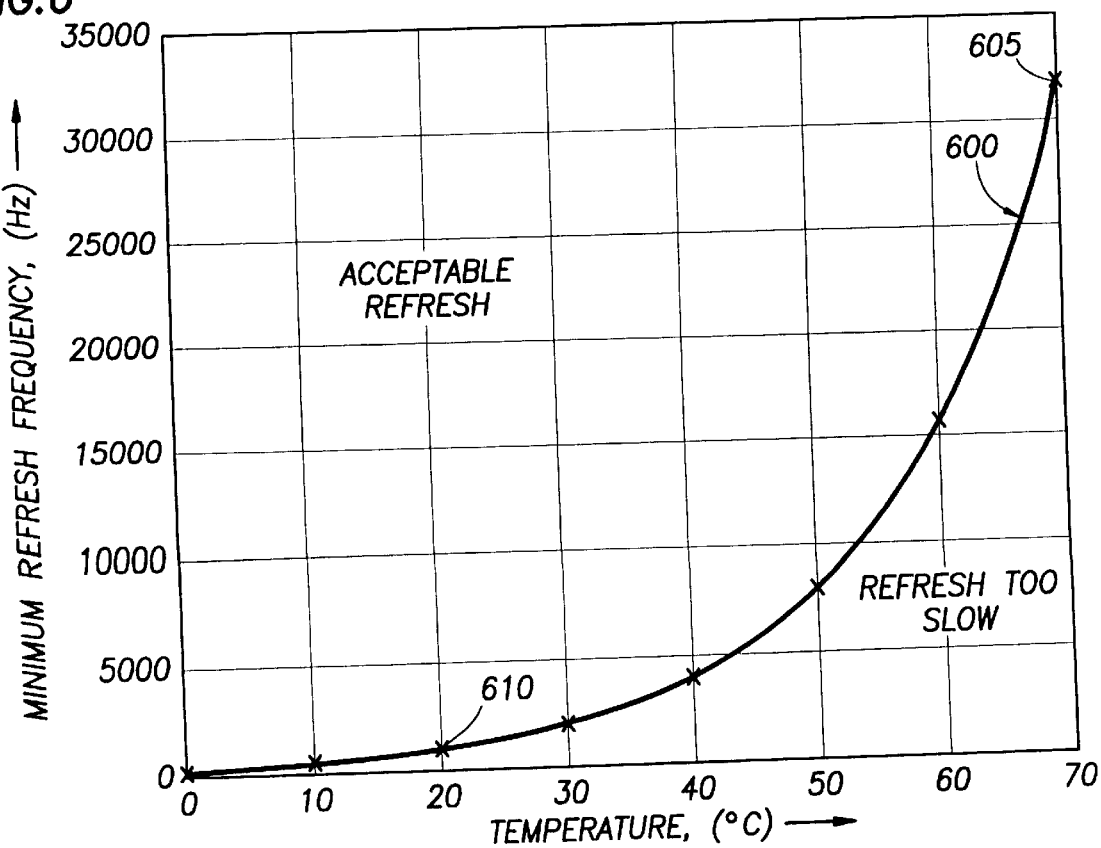
FIG. 6 illustrates a graph of the preferred minimum refresh frequency as a function of memory temperature.

FIG. 6 graphically illustrate equation (1) for a normal operating temperature of main memory 106 of $T_0=70°$ C. and a standard refresh rate of $f_R(T_0)=32$ kHz (i.e., 32,000 Hz). The graph of FIG. 6 traces a smooth curve 600 of the minimum refresh frequency from 0° C. to 70° C. For instance, point 605 represents the standard refresh rate of main memory, 32 kHz, at the normal operating temperature of 70° C. If memory is refreshed at a rate less than 32 kHz when the memory temperature is at 70° C., then memory loss could result. Similarly, point 610 represents a minimum refresh rate of 1 kHz when the memory temperature is 20° C. The area of the graph below curve 600, marked "Refresh Too Slow," represents the refresh rates that may be too low to prevent memory loss. Memory loss should not occur if the combination of temperature and refresh rate is on or above curve 600, in the area marked "Acceptable Refresh." Although a refresh rate anywhere in the "Acceptable Refresh" region will not cause memory loss, the optimum refresh rate for main memory 106 is the minimum refresh rate given by curve 600. Refreshing memory at a point on curve 600 for a given temperature thus permits memory to be refreshed with the least amount of power drain on the computer battery. Thus, to achieve even greater power-savings than in previous embodiments, it would be advantageous to monitor the temperature of main memory 106, keeping the refresh rate as close as possible to curve 600.

FIG. 6 also generally illustrates an advantage of the invention in being able to refresh an entire memory device (i.e., each storage bit comprising the memory device) at a rate less than heretofore possible. It is contemplated that the refresh logic will refresh each storage bit less often than approximately once every 16 milliseconds, and preferably less often than 1000 milliseconds.

Figure 7:
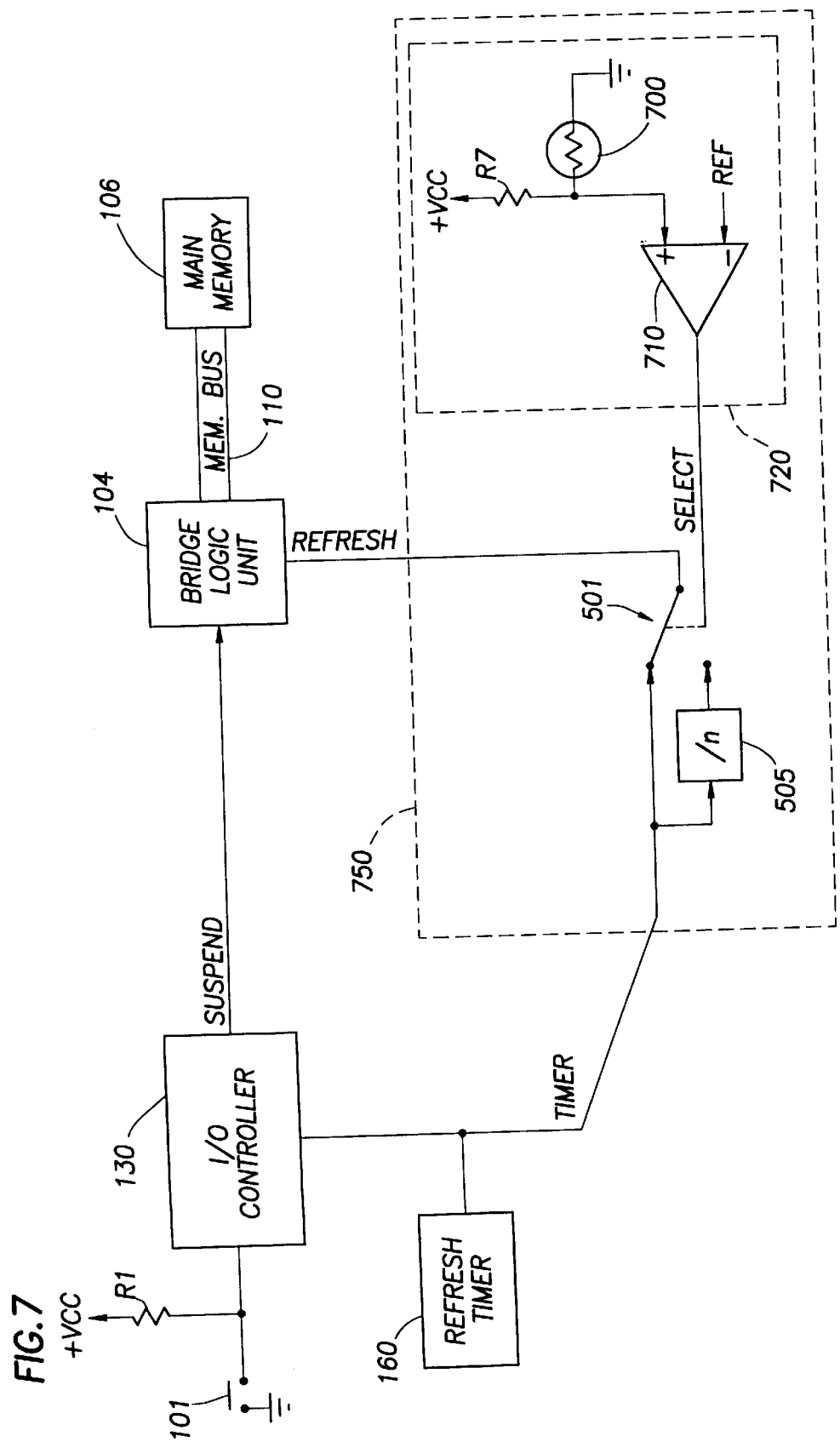
FIG. 7 illustrates a block diagram of an alternative embodiment of the refresh logic of FIG. 1 which uses a temperature sensor.

Accordingly, FIG. 7 illustrates an alternative embodiment of the present invention in which a temperature sensor is used to monitor the temperature of memory and set a suitable refresh rate. This embodiment includes suspend switch 101, I/O controller 130, refresh timer 160, refresh logic 550, bridge logic unit 104, main memory 106, and a temperature sensor unit 720. Temperature sensor unit 720 includes a thermistor 700, resistor R7, and comparator 710. As in previous embodiments, suspend switch 101 initiates and terminates the suspend mode, coupling to pull-up resistor R1 and to P/O controller 130. P/O controller 130 receives a timer signal from refresh timer 160 and provides a suspend signal to the bridge logic unit 104 and to other devices to be suspended (not shown). The refresh signal is generated by refresh logic 550 as in the previous embodiment. Thus, main memory 106 is refreshed either at the standard rate (via the timer signal) or at a reduced rate (provided by divide-by-n unit 505). As in previous embodiments, n preferably is 2 but may be any desired number greater than one.

In the present embodiment, however, the select signal, which controls the state of switch 501 (and, therefore, the refresh rate), is asserted by the temperature sensor 720. The comparator 710 receives a reference voltage Ref to its inverting input terminal (−). Resistor R7 and thermistor 700 connect together and to the noninverting input terminal (+) of comparator 710 as shown. Resistor R7 also connects to power rail $+V_{CC}$ to provide a voltage-divider for the noninverting input terminal (+) of comparator 710.

Thermistor 700 preferably is thermally bonded to main memory 106, so that the temperature of thermistor 700 is substantially the same as that of main memory 106. As one skilled in the art will immediately recognize, however, that there are numerous ways to couple thermistor 700 to main memory 106 so that the temperature of thermistor 700 will represent the main memory temperature. Alternatively, thermistor 700 may be located in a region of computer system 100 that is known to remain at a temperature that is greater than or approximately the same as the temperature of main memory 106. Such a region thus represents a worst case scenario for monitoring the temperature to adjust the refresh rate.

As is generally known, the resistance of a thermistor falls as the temperature rises. Thus, as the temperature of main memory 106 drops, the temperature of thermistor 700 drops as well. In response to the drop in temperature, the resistance of thermistor 700 increases in a known manner. The relationship between temperature and resistance of thermistor 700 is approximately linear. The voltage on the comparator noninverting input terminal (+) is inversely proportional to the resistance of thermistor 700 and thus, the noninverting input terminal (+) receives an increasing voltage as the temperature of main memory 106 decreases. The Ref signal represents the voltage corresponding to the voltage across thermistor 700 when main memory 106 (and, therefore, thermistor 700) reaches a predetermined temperature. The predetermined temperature represents the temperature at which main memory 106 may receive the slower refresh signal from the divide-by-n unit 501. Since this predetermined rate necessarily depends on the value of n corresponding to the divide-by-n unit 505, an appropriate predetermined temperature threshold may be determined using equation (1) for the desired value of n. Alternatively, an appropriate value of n may be determined using equation (1) for any desired predetermined temperature threshold. In a preferred embodiment, the predetermined temperature threshold is 60° C., and the refresh logic 550 comprises a divide-by-n unit 505 in which n=2, i.e., a divide-by-two unit. Accordingly, the refresh rate is cut in half when the temperature drops to 60° C.

When main memory 106 is at normal operating temperature, the relatively low resistance of thermistor 700 produces a voltage less than Ref, causing the comparator to assert select low. When the temperature of main memory 106 drops below the predetermined temperature, comparator 710 receives a voltage equal to or greater than that of the Ref signal. The comparator responds by asserting the select signal, causing the refresh logic 750 to reduce the rate of the refresh signal. Comparator 710 may comprise a device having hysteresis, in which the select signal is asserted and deasserted according to an upper and a lower voltage threshold. If the voltage at the noninverting input terminal (+) rises above the upper threshold (in response to the main memory temperature decreasing), the comparator 710 asserts the select signal. If the memory temperature increases, then comparator 710 deasserts select only after the voltage at the noninverting input terminal (+) decreases below the lower voltage threshold. As is known to those of ordinary skill in the art, hysteresis thus prevents comparator 710 from asserting and deasserting the select signal repeatedly in a short period of time, which often is caused by the normal fluctuations of a slowly-changing input voltage.

It should be noted that numerous other devices and methods exist for determining the temperature of main memory 106, such as a thermocouple or temperature-sensing integrated circuit. These devices may replace thermocouple 700 in alternative embodiments if minor modifications are made to the temperature sensor 720.

Figure 8:
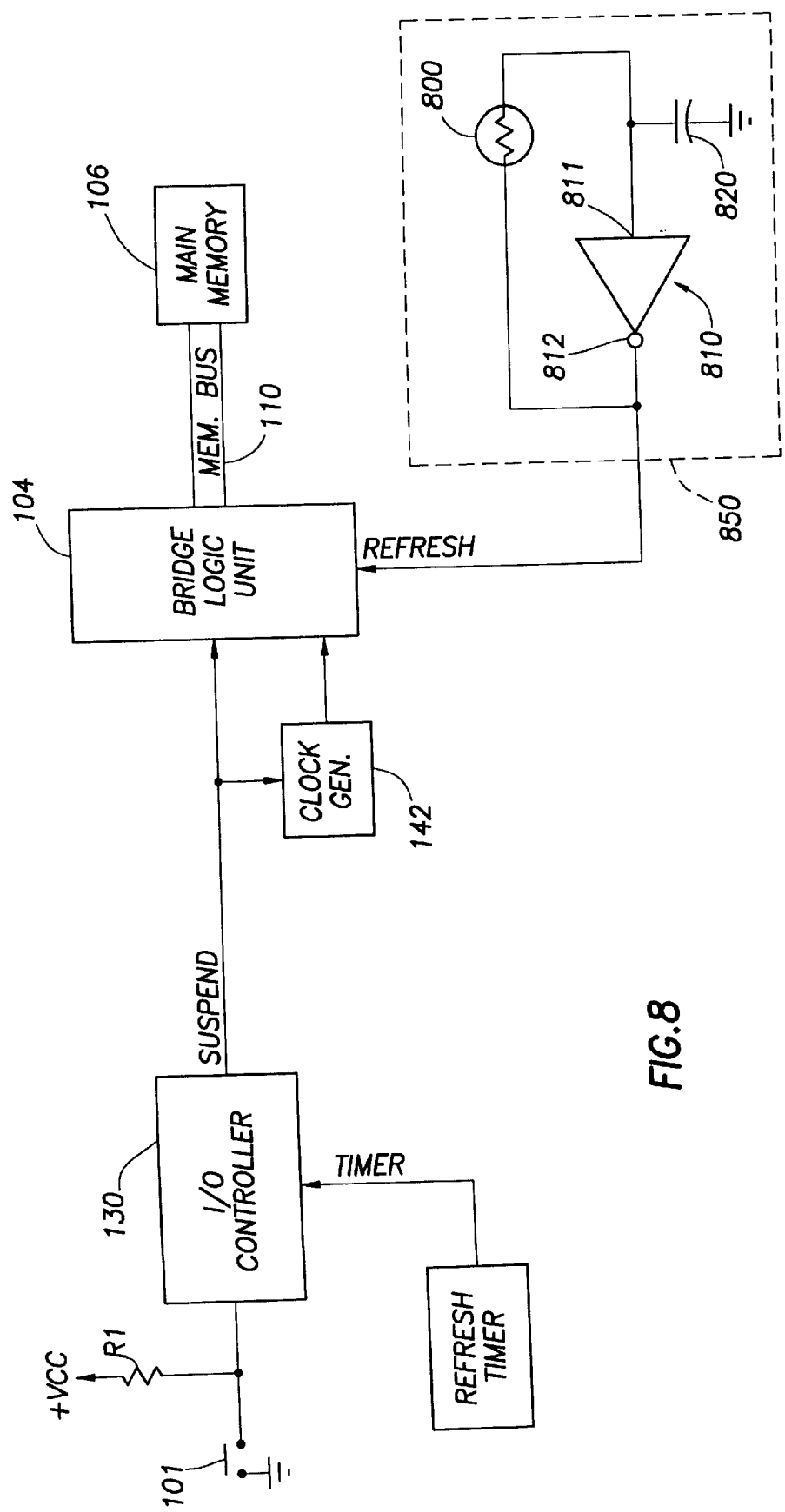
FIG. 8 illustrates a block diagram of an alternative embodiment of the refresh logic of FIG. 1 which continuously varies the refresh rate as a function of temperature.

FIG. 8 illustrates an alternative embodiment to that of FIG. 7, including a refresh generator 850, I/O controller 130, and bridge logic unit 104. I/O controller receives a signal from suspend switch 101, as in previous embodiments, to initiate and terminate suspend mode. In response to the suspend switch 101, the I/O controller 130 asserts a suspend signal to initiate suspend mode in the computer. Bridge logic 104 receives the suspend signal as well as a refresh signal from refresh generator 850. The suspend signal causes bridge logic unit to shut down during suspend mode, using the refresh signal to generate memory refresh commands over the memory bus 110.

In the present embodiment of FIG. 8, refresh generator 850 includes thermistor 800, inverter 810, and capacitor 820. Thermistor 800 connects between the inverter input terminal 811 and inverter output terminal 812, while capacitor 820 connects between the inverter input terminal 811 and ground. The refresh generator 850 produces an output signal that oscillates between logic high and low states. The frequency of oscillation is proportional in frequency to the time constant $$\frac{1}{RC}$$

of the circuit, where R is the resistance of thermistor 800, and C is the capacitance of capacitor 820. As the thermistor resistance R increases in response to a decrease in memory temperature, the resulting decrease in the time constant value $$\frac{1}{RC}$$

lowers the frequency of the refresh signal. The frequency of the refresh signal in this embodiment continuously reduces as temperature decreases, rather than in discrete steps as in prior embodiments. Thus, refresh generator 850 provides a refresh signal that closely follows the temperature/frequency response of curve 600 or any other desired temperature/ frequency response curve. Because the refresh generator 850 continuously maintains the refresh rate as low as possible, main memory 106 consumes a minimum of power, thereby minimizing energy drain on the battery.

As one skilled in the art would recognize, the refresh generator 850 behaves as a voltage controlled oscillator (VCO), a device which produces a periodic waveform having a frequency that changes in response to changes in the input voltage. Hence, a voltage controlled oscillator combined with a temperature sensor could replace the refresh generator 850 in FIG. 8. An example of a suitable temperature sensor is the series BR11 Thermobead manufactured by Thermometric AB, although a person of ordinary skill in the art would immediately recognize numerous other suitable devices. In such a scenario, the temperature sensor couples to main memory 106, providing a voltage to the VCO that represents the main memory temperature. In response, the VCO produces the refresh signal at the proper frequency for refreshing main memory 106.

Due to the inherent duality of capacitors and inductors, capacitor 820 could alternatively be replaced by an inductor using known circuit techniques, with only slight modifications to the refresh generator circuit 850. Such a circuit would produce substantially the same refresh signal as does the present embodiment. Reference may be made to *Fundamentals of Circuit Analysis* by Kendall L. Su (Waveland Press, 1993), chapters 6 through 8, for a more thorough description of these techniques, including duality of capacitors and inductors.

Figure 9:
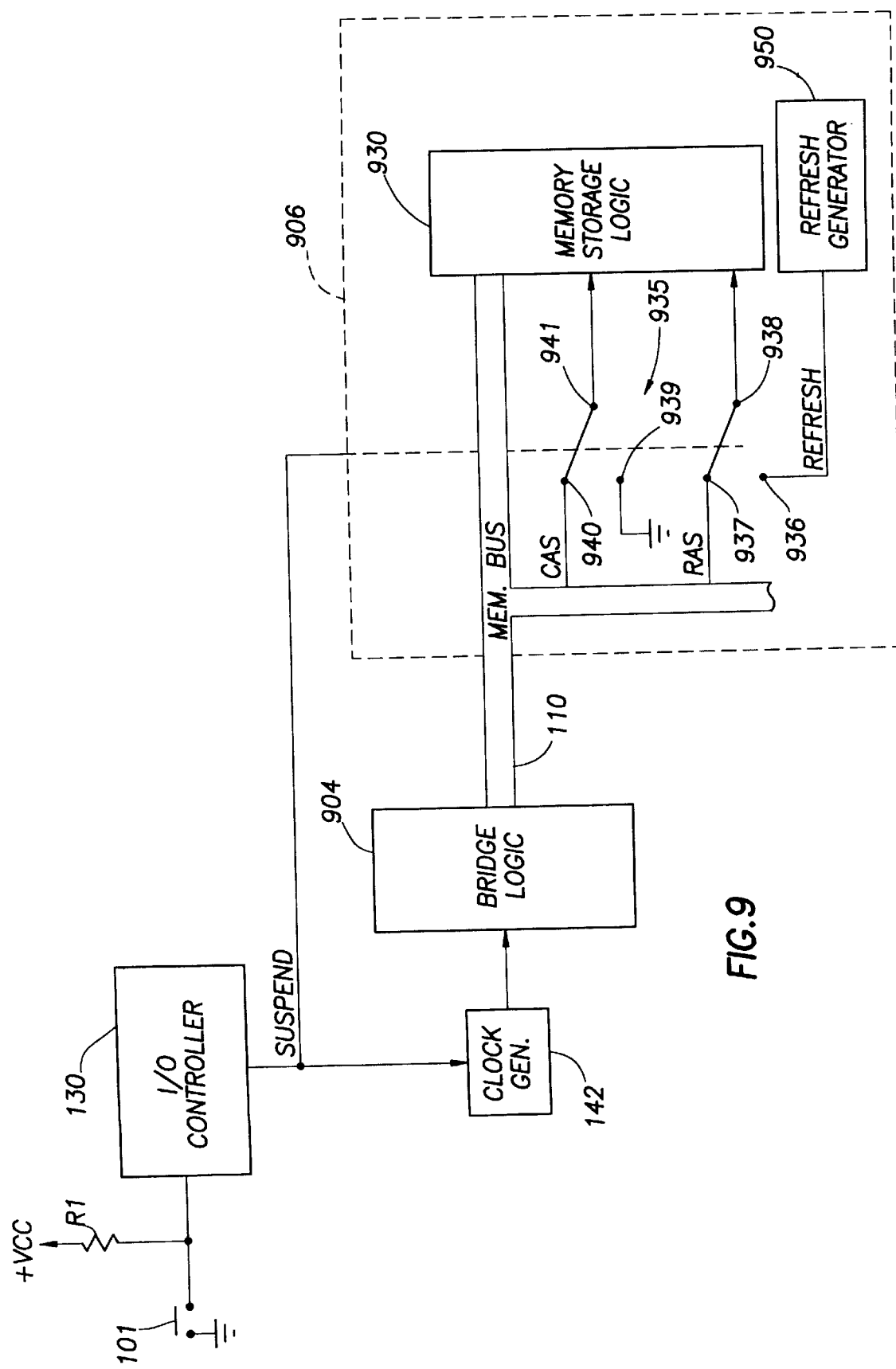
FIG. 9 illustrates a block diagram of an alternative embodiment of the refresh logic of FIG. 1 incorporated into a memory module.

FIG. 9 illustrates an alternative embodiment of the present invention that includes I/O controller 130, bridge logic unit 904, and main memory 906. Main memory 906 represents an alternative embodiment of main memory 106 that preferably comprises DRAM circuitry, although main memory 906 may also represent a single inline memory module (SIMM), dual inline memory module (DIM), or other circuit card containing memory devices. Accordingly, main memory 906 comprises memory storage logic 930, switch 935, and refresh generator 950 comprising of thermistor 800, inverter 810, and capacitor 800. I/O controller 130 receives an input signal from suspend switch 101, as in previous embodiments, to initiate or terminate suspend mode. Accordingly, I/O controller 130 asserts the suspend signal to clock generator 142 to shut down bridge logic unit 904, as well as other components (not shown) that normally cease operating during suspend mode. Bridge logic unit couples to memory storage logic 930 via the memory bus 110, which includes the RAS and CAS memory bus signals.

Switch 935, which preferably is a double-pole, single-throw (DPST) switch, comprises output terminals 938 and 941 and input terminals 936, 937, 939, and 940. Output terminals 938 and 941 provide the RAS and CAS signals, respectively, to memory storage logic 930, and the suspend signal controls the state of switch 935. When suspend is deasserted, output terminal 938 (coupled to memory storage logic RAS) connects to input terminal 937, which receives the RAS signal from memory bus 110. Output terminal 941 (coupled to memory storage logic CAS) receives the CAS signal from the memory bus 110 via input terminal 940, when suspend is deasserted. When suspend is asserted, output terminals 938 and 941 connect to input terminals 936 and 939, respectively. Because switch input terminal 939 couples to ground, memory storage logic 930 receives a constant-low CAS signal via output terminal 941 when suspend is asserted. Refresh generator 950 provides to input terminal 936 a refresh signal that drives memory storage logic 930, via output terminal 938, when suspend is asserted.

The refresh generator 950 of FIG. 9 preferably is substantially the same as that detailed in FIG. 8 and comprises thermistor 800, capacitor 820, and inverter 810. The refresh generator 950 generates a periodic refresh signal having a frequency proportional to $$\frac{1}{RC},$$

where R is the resistance of thermistor 800, and C is the capacitance of capacitor 820. Thermistor 800 preferably is integrated within main memory 906 and thus directly senses the temperature of the memory device. Accordingly, the temperature of thermistor 800 represents the temperature of memory storage logic 930, and the refresh frequency decreases approximately in proportion to the decrease in the temperature of memory storage logic 930, without endangering the integrity of memory data. The power consumed by main memory 906 drops approximately proportionately to the drop in refresh rate, thereby conserving battery energy for use during normal computer operation.

The temperature-sensing refresh generator 950 is contained entirely within main memory 906. Thus, the present invention may conveniently be incorporated into any computer system by substituting memory modules having the features of main memory 906,. including refresh generator 950 and switch 935, and capable of receiving the suspend signal.

It should be understood that the embodiments disclosed herein should not be construed as limited to a DRAM module requiring a normal refresh rate of 32 kHz. In fact, a DRAM module requiring greater or less than 32 kHz could be incorporated into the present invention and may achieve refresh rates even lower than those disclosed herein, without departing from the principles of the present invention. Additionally, the embodiments disclosed herein should not be construed as limited to laptop computers, or even to personal computers. The principles of the present invention may be applied to any device that includes dynamic access random memory.

Hence, the embodiments of the invention described above enable a computer system to consume a minimum quantity of power during suspended operation by lowering the memory refresh rate in response to decreases in operating temperature. Because the refresh rate may be decreased by up to a factor of thirty-two, in some embodiments, or by even greater factors for sufficient decreases in temperature, the resulting power savings can be substantial. Further, the present invention may be used in any number of configurations. In one configuration, the refresh logic is included either as a separate component of the computer system or inside a bridge logic device to be used with any desired type of dynamic random access memory. In another configuration, the refresh logic is housed inside memory modules which may be incorporated into virtually any standard computer system. The temperature-dependency of the present invention may also be invoked in numerous ways, both direct and indirect. In the embodiments of FIGS. 2A, 3A, 4, and 5, the temperature is estimated indirectly using a clock or counter to measure the time needed for the computer to cool during suspend mode. In the embodiments of FIGS. 7–9, the temperature is estimated directly using a thermistor or other temperature sensor, and the refresh rate is adjusted accordingly.

Numerous variations and modifications will become apparent to those skilled in the art once the above disclosure is fully appreciated. It is intended that the following claims be interpreted to embrace all such variations and modifications.

What is claimed:

1. A computer system, comprising:
   an input device;
   a memory device that stores data;
   a processor that receives an input signal from said input device and that accesses said memory device; and
   a refresh logic that provides a periodic refresh signal to refresh said memory device, and wherein the refresh logic is capable of selectively varying the rate of the refresh signal as a function of a time the computer system has been in a reduced power mode of operation.

2. A computer system as in claim 1 wherein said refresh logic provides the refresh signal at a first refresh rate for a first predetermined period of time and provides the refresh signal at a second refresh rate after the first predetermined time period elapses.

3. A computer system as in claim 1 wherein said processor asserts a select signal to said refresh logic to cause said refresh logic to vary the refresh rate.

4. A computer system comprising:
   an input device;
   a memory device that stores data;
   a processor capable of receiving an input signal from said input device, said processor being adapted to access said memory device; and
   a refresh logic that provides a periodic refresh signal to refresh said memory device, wherein said refresh logic is capable of selectively varying the rate of the refresh signal as a function of time;
   wherein said refresh logic provides the refresh signal at a first refresh rate for a first predetermined period of time and provides the refresh signal at a second refresh rate after the first predetermined time period elapses; and
   wherein said refresh logic comprises a counter which generates a select signal when the first predetermined time period has expired, the select signal causing said refresh logic to provide the refresh signal at the second refresh rate.

5. A computer system as in claim 4 wherein said refresh logic includes a divide-by-two unit receiving a timing signal and generating a divided output signal, wherein said refresh logic selects the timing signal as the refresh signal at the first refresh rate and selects the divided output signal as the refresh signal at the second refresh rate.

6. A computer system comprising:
   an input device;
   a memory device that stores data;
   processor capable of receiving an input signal from said input device, said processor being adapted to access said memory device; and
   a refresh logic that provides a periodic refresh signal to refresh said memory device, wherein said refresh logic is capable of selectively varying the rate of the refresh signal as a function of time;
   wherein said refresh logic provides the refresh signal at a first refresh rate for a first predetermined period of time and provides the refresh signal at a second refresh rate after the first predetermined time period elapses; and
   wherein said refresh logic provides the refresh signal at the second refresh rate for a second predetermined period of time and provides the refresh signal at a third refresh rate after the second predetermined time period elapses.

7. A computer system as in claim 6 wherein said refresh logic comprises a counter which generates select signals to indicate when the first and second predetermined time periods have expired, and wherein the state of the select signals encodes the refresh rate.

8. A computer system as in claim 7 wherein said refresh logic includes at least one frequency divider receiving a timing signal and generating a first divided output signal and second divided output signal having different rates, and wherein said refresh logic chooses between the timing signal, the first divided output signal, and the second divided output signal to refresh said memory device based on the state of the select signals.

9. A computer system as in claim 6 wherein said refresh logic provides the refresh signal at the third refresh rate for a third predetermined period of time and provides the refresh signal at a fourth refresh rate after the third predetermined time period elapses.

10. A computer system as in claim 9 wherein said refresh logic comprises a counter which generates select signals to indicate when the first, second, and third predetermined time periods have expired, the state of the select signals determining the refresh rate.

11. A computer system as in claim 10 wherein said refresh logic includes at least one frequency divider receiving a timing signal and generating a plurality of divided output signals having different rates, and wherein said refresh logic chooses either the timing signal or one of said plurality of divided output signals to refresh said memory device based on the state of the select signals.

12. A computer system comprising:
    an input device;
    a memory device that stores data;
    a refresh logic that provides a periodic refresh signal to refresh said memory device, wherein said refresh logic is capable of selectively varying the rate of the refresh signal as a function of time;
    a processor capable of receiving an input signal from said input device, said processor being adapted to access said memory device, wherein said processor asserts a select signal to said refresh logic to cause said refresh logic to vary the refresh rate; and
    a counter which asserts an interrupt signal to said processor after a predetermined period of time, said interrupt signal causing said processor to assert said select signal.

13. A computer system as in claim 12 wherein said refresh logic device comprises a divide-by-two unit providing an output signal at a lower rate than the refresh rate, said refresh logic device choosing the output signal of the divide-by-two unit as the refresh signal if the select signal is asserted by the processor.

14. A refresh logic adapted to provide a refresh signal to memory during suspend mode in a microprocessor-based system, said refresh logic capable of selectively varying the rate of the refresh signal as a function of time such that the refresh rate changes after a predetermined period of time following the onset of suspend mode, comprising:
    a counter that asserts a select signal at said predetermined period of time to cause the refresh rate to change; and
    a refresh generator that provides the refresh signal at a particular rate based on the value of the select signal.

15. A refresh logic adapted to provide a refresh signal to memory during suspend mode in a microprocessor-based system, said refresh logic capable of selectively varying the rate of the refresh signal as a function of time such that the refresh rate changes after a predetermined period of time following the onset of suspend mode, comprising:

refresh timer that provides the refresh signal before the predetermined period of time; and a divide-by-two unit coupled to said refresh timer and that provides the refresh signal after the predetermined period of time.

16. A refresh logic adapted to provide a refresh signal to memory during suspend mode in a microprocessor-based system, said refresh logic capable of selectively varying the rate of the refresh signal as a function of time such that the refresh rate changes at each of a plurality of predetermined time periods, comprising:

a counter that generates select signals at said predetermined time periods, the state of the select signals determining the refresh rate; and a switch that chooses one of a plurality of refresh rates based on the state of the select signals.

17. A refresh logic adapted to provide a refresh signal to memory during suspend mode in a microprocessor-based system, said refresh logic capable of selectively varying the rate of the refresh signal as a function of time such that the refresh rate changes at each of a plurality of predetermined time periods, comprising:

a frequency divider which receives a timing signal and generates a plurality of divided output signals, wherein each of the divided output signals has a different rate; and a switch, whereby said refresh logic chooses between the divided output signals to select the refresh signal.

18. A memory device comprising:

a refresh logic unit that provides an internal refresh signal having a variable refresh frequency; and a switch through which said memory device receives a select signal and an external refresh signal;

wherein said memory device uses the internal refresh signal to refresh memory if the select signal is asserted and uses the external refresh signal to refresh memory if the select signal is deasserted.

19. A method for refreshing a memory device in a computer system, comprising:

(a) refreshing said memory device at an initial rate for a first predetermined period of time after initiation of a reduced power mode of operation of the host computer system; and (b) refreshing said memory device at a second rate after the first predetermined period of time.

20. A method as in claim 19 further including:

(c) generating an initial signal having an initial rate;

(d) generating a second signal having a second rate;

(e) counting until the first predetermined period of time elapses;

(f) refreshing said memory device with the initial signal before the first predetermined period of time elapses; and (g) refreshing said memory device with the second signal after said first predetermined period of time elapses.

21. A method as in claim 20 further including generating the second signal by sending the initial signal through a frequency divider.

22. A method as in claim 19 further including changing the refresh rate at each of a plurality of predetermined time periods.

23. In a computer system having a processor receiving input signals from an input device and a memory device that stores data, a method of reducing power consumption in the computer system comprising:

operating the computer system in a low power mode of operation, and while the computer system is in a low power mode of operation;

providing a periodic refresh signal to the memory device; and slowing the rate of the periodic refresh signal to slow the refresh rates of the memory device as the memory device becomes able to retain data with a slower refresh rate.

24. A computer system, comprising:

an input device;

a memory device that stores data;

a processor that receives an input signal from an input device and that accesses said memory device; and a refresh logic adapted to provide a refresh signal to refresh said memory device, wherein the refresh logic is further adapted to vary the rate of the refresh signal based on a selected parameter after the computer system is placed in a suspend mode.

* * * * *